United States Patent
Hussien et al.

(10) Patent No.: US 12,230,664 B2
(45) Date of Patent: Feb. 18, 2025

(54) CARBON NITRIDE NANOSENSOR FOR EFFECTIVE AND ULTRASENSITIVE X-RAY DETECTION

(71) Applicant: QATAR UNIVERSITY, Doha (QA)

(72) Inventors: Belal Salah Mohammed Hussien, Ash Sharkia Governorate (EG); Kamel Abdelmoniem Mohamed Eid, Sharkia (EG); Aboubakr Moustafa Abdullah, Giza (EG); Mohammad K. Hassan, Hattiesburg, MS (US); Leena Abdulrahman H B Al-Sulaiti, Doha (QA); Kenneth Ikechukwu Ozoemena, Johannesburg (ZA)

(73) Assignee: QATAR UNIVERSITY, Doha (QA)

( * ) Notice: Subject to any disclaimer, the term of this patent is extended or adjusted under 35 U.S.C. 154(b) by 305 days.

(21) Appl. No.: 17/967,500

(22) Filed: Oct. 17, 2022

(65) Prior Publication Data

US 2023/0119044 A1   Apr. 20, 2023

Related U.S. Application Data

(60) Provisional application No. 63/256,955, filed on Oct. 18, 2021.

(51) Int. Cl.
*H01L 27/146* (2006.01)
*G01N 23/083* (2018.01)
*H01L 31/0264* (2006.01)

(52) U.S. Cl.
CPC ..... *H01L 27/14658* (2013.01); *G01N 23/083* (2013.01); *H01L 31/0264* (2013.01)

(58) Field of Classification Search
CPC ............ G01N 23/083; H01L 27/14658; H01L 31/0264; H01L 31/032; H01L 31/0321; H01L 31/036; H01L 31/085
See application file for complete search history.

(56) References Cited

U.S. PATENT DOCUMENTS

| | | | |
|---|---|---|---|
| 2013/0256627 A1 | 10/2013 | Jain et al. | |
| 2020/0080188 A1* | 3/2020 | Zhang | C23C 14/0658 |
| 2023/0119044 A1* | 4/2023 | Hussien | G01N 23/083 |
| | | | 378/62 |

FOREIGN PATENT DOCUMENTS

| | | |
|---|---|---|
| JP | 2015151358 A | 8/2015 |
| WO | 2014/069818 A1 | 5/2014 |
| WO | 2016/102746 A1 | 6/2016 |
| WO | 2018/008825 A1 | 1/2018 |

OTHER PUBLICATIONS

Richard A. Boucher et al., "A carbon nanotube based x-ray detector", IOP Publishing, Nanotechnology 27 (2016) 475501 (9pp), doi: 10.1088/0957-4484/27/47/475501, 10 pages.

(Continued)

*Primary Examiner* — David P Porta
*Assistant Examiner* — Casey Bryant
(74) *Attorney, Agent, or Firm* — SQUIRE PATTON BOGGS (US) LLP

(57) ABSTRACT

Presented herein are X-ray sensors comprising graphitic carbon nitride materials (gCNs) and a processes for the manufacture of the gCNs and X-ray sensors.

30 Claims, 18 Drawing Sheets

(56) References Cited

OTHER PUBLICATIONS

Ning-Qin Deng et al., "Total-Ionizing-Dose Effects on a Graphene X-Ray Detector Laser-Scribed From Graphene Oxide", IEEE Transactions on Nuclear Science, vol. 65, No. 1, Jan. 2018, DOI: 10.1109/TNS.2017.2776201, 5 pages.

Edward Cazalas et al, "Position sensitivity of graphene field effect transistors to X-rays", Applied Physics Letters 106, 223503 (2015), https://doi.org/10.1063/1.4921755, 6 pages.

Heetak Han et al., "Enhancement of X-ray detection by single-walled carbon nanotube enriched flexible polymer composite", Nanoscale Research Letters 2014, 9:610, http://www.nanoscalereslett.com/content/9/1/610, 11 pages.

Qingsheng Kang et al., "The use of semiconducting single-walled carbon nanotube films to measure X-ray dose", Carbon 50 (2012) 2197-2201, www.sciencedirect.com; www.elsevier.com/locate/carbon, doi:10.1016/j.carbon.2012.01.032, 5 pages.

Qingsheng Kang et al., "Electrical Resistance Response Evaluation of Semiconducting Single-Walled Carbon Nanotube Film for X-ray Sensing", 2011 11th IEEE International Conference of Nanotechnology Portland Marriott, Aug. 15-18, 2011, Portland, Oregon, USA, 5 pages.

Ozhan Koybasi et al., "Detection of light, X-rays, and gamma rays using graphene field effect transistors fabricated on SiC, CdTe, and AlGaAs/GaAs substrates", 6 pages.

Ozhan Koybasi et al., "Design and Simulation of a Graphene DEPFET Detector", 2012 IEEE Nuclear Science Symposium and Medical Imaging Conference Record, 6 pages.

Xiangming Liu et al., "Enhanced X-ray photon response in solution-synthesized $CsPbBr_3$ nanoparticles wrapped by reduced graphene oxide", Solar energy Materials and Solar Cells 187 (2018) 249-254, www.elsevier.com/locate/solmat, https://doi.org/10.1016/j.solmat.2018.08.009, 6 pages.

A. Patil et al., "Graphene Field Effect Transistor as Radiation Sensor", 2011 IEEE Nuclear Science Symposium Conference Record, 5 pages.

Yair Paska et al., "Interactive Effect of Hysteresis and Surface Chemistry on Gated Silicon Nanowire Gas Sensors", ACS Applied Materials & Interfaces 2012, 4, 26-4-2617, www.acsami.org, dx.doi.org/10.1021/am300288z, 19 pages.

Xiao-Wu Tang et al., "Measurement of ionizing radiation using carbon nanotube field effect transistor", Institute of Physics Publishing, Physics in Medicine and Biology 50 (2005), N23-N31, stacks.iop.org/PMB/50/N23, doi:10.1088/0031-9155/50/3/N02, 10 pages.

* cited by examiner

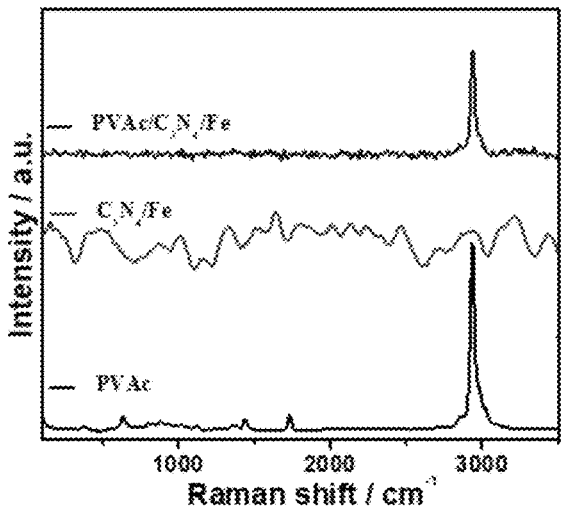
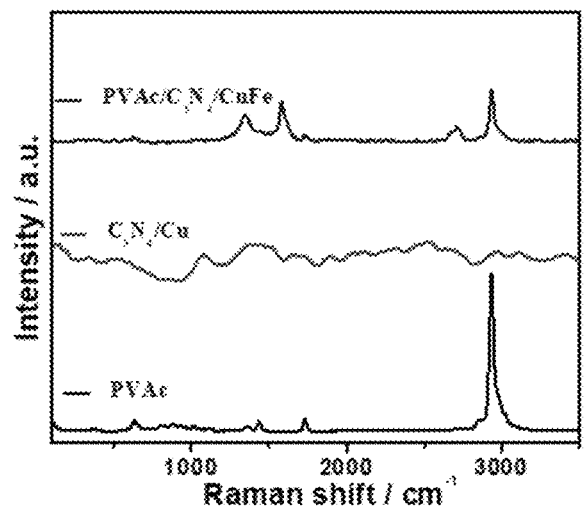
FIG. 5C    FIG. 5D
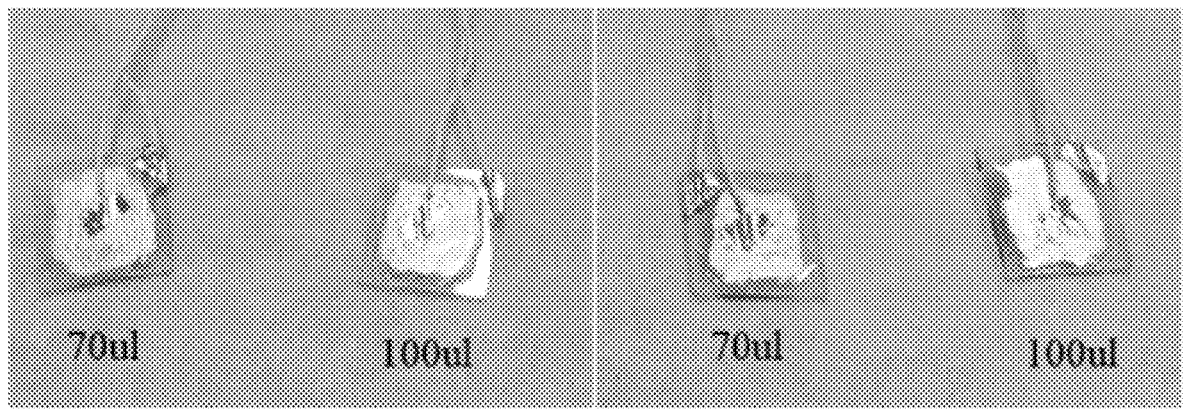
FIG. 6A    FIG. 6B

CARBON NITRIDE NANOSENSOR FOR EFFECTIVE AND ULTRASENSITIVE X-RAY DETECTION

This application claims priority to, and the benefit of, U.S. Provisional Patent Application No. 63/256,955 filed Oct. 18, 2021. The entirety of this application is incorporated herein by reference for all purposes.

FIELD

Presented herein are X-ray sensors comprising graphitic carbon nitride materials (gCNs) and processes for the manufacture of the gCNs and X-ray sensors.

BACKGROUND

X-rays detectors are of great importance in security, health, environmental remediation, safety, military, and industrial applications. Existing X-ray detection materials include direct and indirect X-ray detection. Indirect X-rays detection including a photodiode coupled to a scintillator, or the enclosure of scintillators in an organic matrix. Indirect X-ray detection is based on a simultaneous two-step process between the X-ray irradiation and the generation of an electrical signal. In the first step, X-ray is converted into visible light, while in the second step, visible light is converted into an electrical signal. Direct X-ray detection does not use a scintillator and X-ray photons are directly converted into electrons.

Organic semiconductors (i.e., thin, thick films of carbon, graphene, photoactive polymers, or carbon nanotubes), inorganic-organic semiconductors, organic semiconductor single crystals, perovskite (i.e., thin films, perovskite single crystals, and sintered perovskite wafers), and metal oxides are the main materials for direct X-ray detection. Despite progress made in the direct X-rays detection materials, their high-cost, high dark current, high operational voltages, inferior sensitivity over broad energy range; and inferior X-ray attenuation. This is in addition to complicated fabrication methods and their low production yields which make them impractical for large-scale applications.

The fabrication of X-ray sensors based on organic, inorganic, and/or hybrid materials, for example, carbon-based materials, is less commonly reported. Carbon-based sensors have been reported, including carbon nanotubes with and without polymer as described in Tang, X.-W., et al., Physics in Medicine & Biology, 2005. 50(3): p. N23; Patil, A., et al., Graphene field effect transistor as radiation sensor in 2011 IEEE Nuclear Science Symposium Conference Record. 2011. IEEE; Kang, Q. and J. T. Yeow. Electrical resistance response evaluation of semiconducting single-walled carbon nanotube film for X-ray sensing in 2011 11th IEEE International Conference on Nanotechnology. 2011. IEEE; Koybasi, O., et al., Design and simulation of a graphene DEPFET detector in 2012 IEEE Nuclear Science Symposium and Medical Imaging Conference Record (NSS/MIC). 2012. IEEE; Kang, Q., J. T. Yeow, and R. Barnett, Carbon, 2012. 50(6): p. 2197-2201; Koybasi, O., et al., Detection of light, X-rays, and gamma rays using graphene field effect transistors fabricated on SiC, CdTe, and AlGaAs/GaAs substrates in 2013 IEEE Nuclear Science Symposium and Medical Imaging Conference (2013 NSS/MIC). 2013. IEEE; and, Han, H., et al., Nanoscale research letters, 2014. 9(1): p. 1-7.

U.S. Patent Application 2013/0256627 assigned to Lehigh University discloses sensors for IR radiation, UV radiation, and X-rays that comprise single-walled carbon nanotubes or graphene and combinations thereof. KR Patent No. 100898903 B1 describes the use of a carbon nanotube-based X-ray source for therapeutic purposes. PCT Application WO 2014/069818 describes the use of X-ray detectors that comprise a graphene membrane and U.S. Patent Application 2017/0356795 assigned to Nokia Technologies describes radiation sensors that comprise electrical connections made at least partially from graphene. Additional X-ray detectors made from graphene with metal nanoparticles, perovskite, and metal carbide are described in Cazalas, E., et al., Applied Physics Letters, 2015. 106(22): p. 223503; Boucher, R. A., et al., Nanotechnology, 2016. 27(47): p. 475501; Deng, N.-Q., et al., IEEE Transactions on Nuclear Science, 2017. 65(1): p. 473-477; and, Liu, X., etal., Solar Energy Materials and Solar Cells, 2018. 187: p. 249-254. Hybrid carbon-metal complexes for X-ray sensing are described in JP Patent Application JP2015151358 assigned to Fujifilm Corp.

Carbon nitride materials are of particular interest in multi multidisciplinary applications, including but not limited to, water treatment, catalysis, energy conversion, and energy storage applications, however their utilization in X-rays detection is not yet addressed.

SUMMARY OF THE INVENTION

Described herein are graphitic carbon nitride materials (gCN) with tunable size, shape, and composition. These gCN exhibit excellent thermal, chemical, and mechanical stability. In certain embodiments, the graphitic carbon nitride materials (gCN) further comprise iron (Fe), copper (Cu), or a combination of iron and copper.

The gCNs are produced from inexpensive and earth-abundant materials and can cover large areas (from centimeter to meter scale) on various conductive substrates (polymer, glass, and indium tin oxide (ITO)) to form highly sensitive and efficient X-ray detectors. In certain embodiments, for example, as provided in Table 1, the X-ray detectors comprising the gCNs described herein are characterized by ultra-high sensitivity (about 0.2-50.6 $PCGy^{-1} cm^{-2}$), low operational voltages, wide broad energy ranges (−10 to 100 V), and/or quick responses (about 0.1 to 1.8 sec) as well as low dark current (about 0.42-5.12 PA $mm^2$). In certain embodiments, the sensor exhibits a quick response of up to 0.36 seconds and a low dark current between about 0.6-0.8 PA $mm^2$.

In one embodiment, the gCN sensor comprises carbon nitride and a single metal atom selected from iron (Fe) and copper (Cu) or a combination of iron and copper (FeCu). These sensors in particular combine the unique physio-chemical properties of gCNs (i.e., electronic, bi-functional, electron-rich density, semiconducting properties, and thermal-chemical-mechanical stability) and the unique merits of a single metal atom (i.e., high surface area, quantum effect active sites, and accessible active adsorption sites).

In one embodiment, the gCNs X-ray sensors described herein have rich electron density, low bandgap (2.7 eV), porosity, and abundant active sites that accelerate the charge mobility. This results in decreasing the dark current between 0.6 and 0.8 PA $mm^2$, which enables efficient X-ray detection.

In one embodiment, the gCNs X-ray detectors described herein exhibit ultra-high sensitivity (about 3.98-10.35 $PCGy^{-1}cm^{-2}$), work under low operational voltages, and over wide broad energy ranges, for example, from 15 to 100 V.

In one embodiment, the gCNs X-ray detectors described herein are ultra-fast with a prompt quick response of up to about 0.36 seconds to an X-ray dose of 2.4 Gys$^{-1}$.

In one embodiment, the gCN-based X-ray sensor is used successfully for the detection of X-ray at room temperature, in air, and/or over wide broad energy ranges (15-100 V). In one embodiment, the sensor is scaled up for X-ray imaging. In one embodiment, the applied potential is lower than 1 V.

Also provided herein is a method for producing the gCNs described herein comprising a rational one-step fabrication in high yield. In certain embodiments, the gCN is produced in about 100% yield. In certain embodiments, the gCN is prepared in large amounts, for example from several grams to kilograms. Additionally, the sensors can be produced in high mass (several grams in one run) from a wide variety of earth-abundant and inexpensive resources.

BRIEF DESCRIPTION OF FIGURES

FIG. 5C is the Raman spectra of Fe/gCNs with and without PVACs.
FIG. 5D is the Raman spectra of CuFe/gCNs with and without PVACs.
FIG. 6A is an image of X-ray devices comprising gCNs over an ITO substrate wherein the gCN is cast in the ITO with thicknesses of 70 μM (left) and 100 μM (right).
FIG. 6B is an image of X-ray devices comprising Cu/gCNs over an ITO substrate wherein the Cu/gCN is cast in the ITO with thicknesses of 70 μM (left) and 100 μM (right).

μM under different X-ray doses from 0.2 to 2.4 Gy/s and an applied voltage of 15 V, 50 V, and 100 V.

Figure 10A:
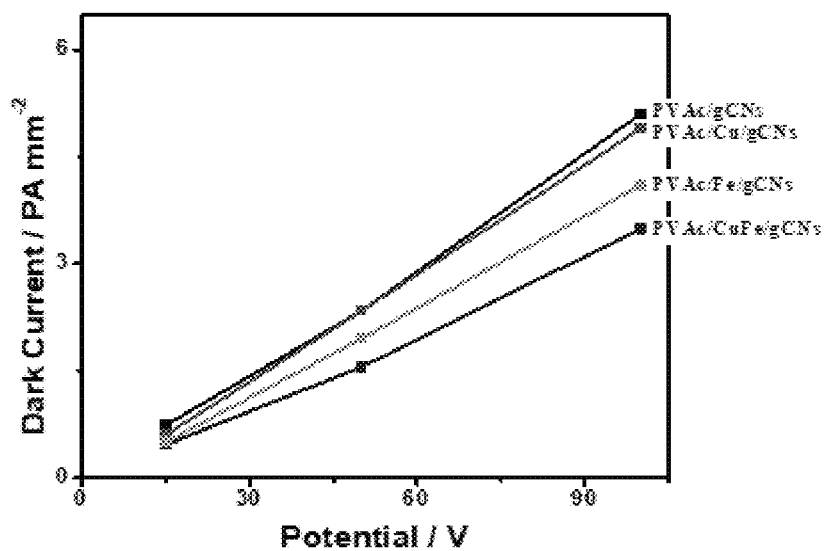

FIG. 10A is a graph comparing the X-ray off dark current density as a function of applied potential of X-ray detection devices fabricated with PVAc/gCNs, PVAc/Cu/gCNs, PVAc/Fe/gCNs, and PVAc/CuFe/gCNs with a thickness of 70 μM.

Figure 10B:
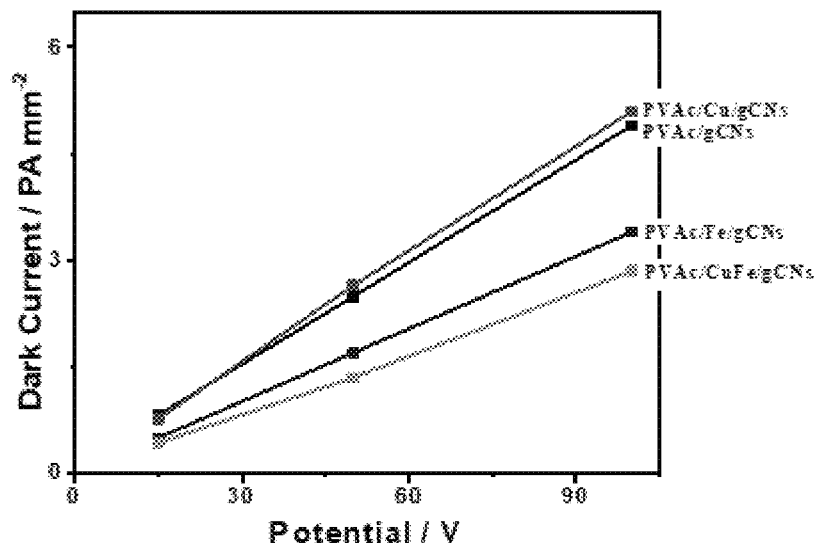

FIG. 10B is a graph comparing the X-ray off dark current density as a function of applied potential of X-ray detection devices fabricated with PVAc/gCNs, PVAc/Cu/gCNs, PVAc/Fe/gCNs, and PVAc/CuFe/gCNs with a thickness of 100 μM.

Figure 11A:
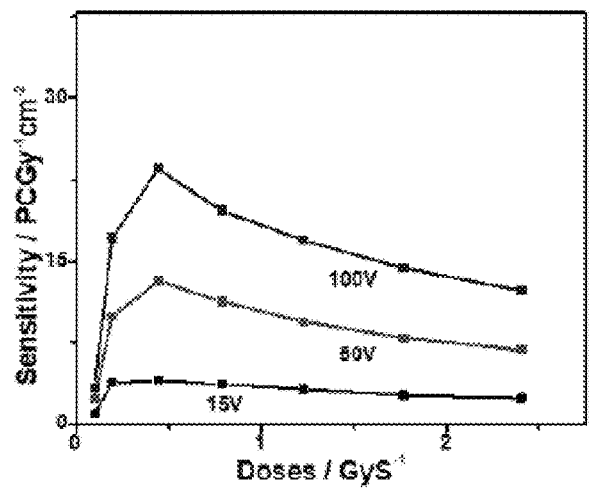

FIG. 11A is a graph of the X-ray current and dark currents measured at 15, 50, and 100 V under different doses from 0.2 to 2.4 Gy/S using the X-ray detection device fabricated with gCNs with a thickness of 70 μm.

Figure 11B:
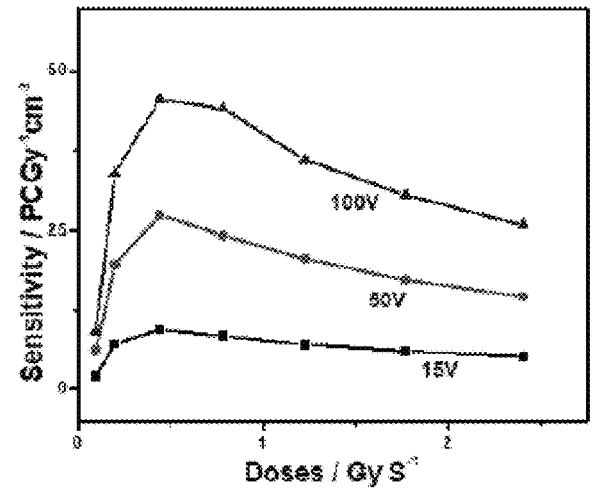

FIG. 11B is a graph of the X-ray current and dark currents measured at 15, 50, and 100 V under different doses from 0.2 to 2.4 Gy/S using the X-ray detection device fabricated with Cu/gCNs with a thickness of 70 μm.

Figure 11C:
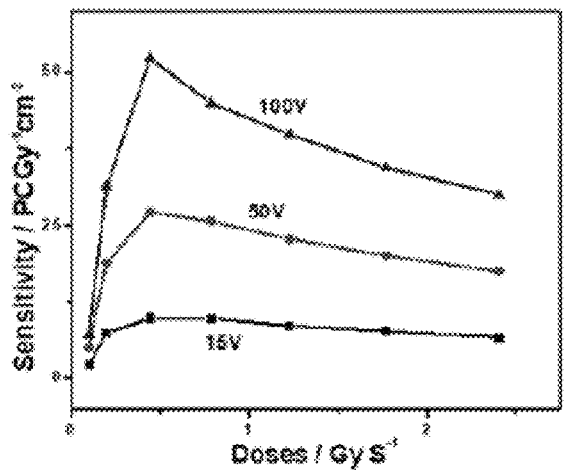

FIG. 11C is a graph of the X-ray current and dark currents measured at 15, 50, and 100 V under different doses from 0.2 to 2.4 Gy/S using the X-ray detection device fabricated with Fe/gCNs with a thickness of 70 μm.

Figure 11D:
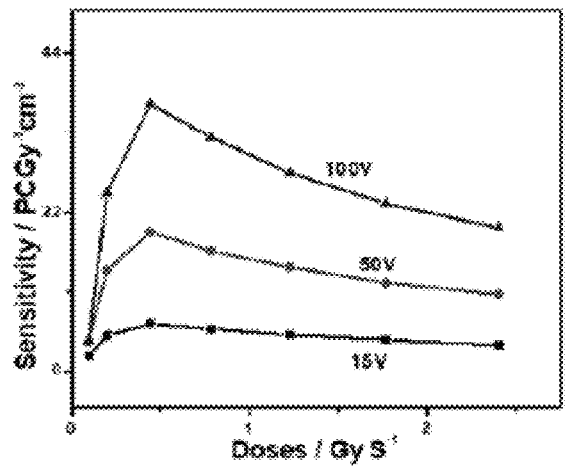

FIG. 11D is a graph of the X-ray current and dark currents measured at 15, 50, and 100 V under different doses from 0.2 to 2.4 Gy/S using the X-ray detection device fabricated with CuFe/gCNs with a thickness of 70 μm.

Figure 12A:
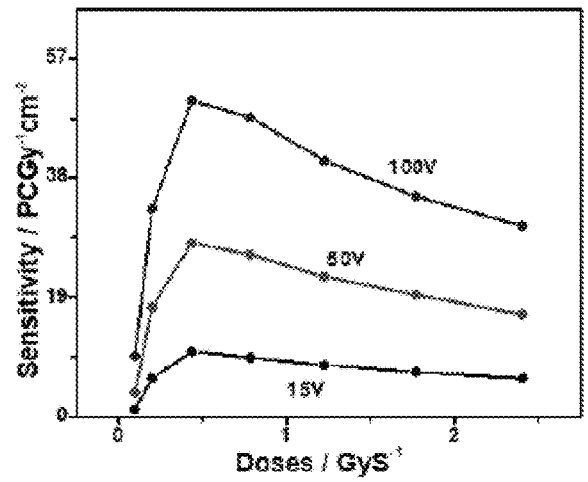

FIG. 12A is a graph of the X-ray current and dark currents measured at 15, 50, and 100 V under different doses from 0.2 to 2.4 Gy/S using the X-ray detection device fabricated with gCNs with a thickness of 100 μm.

Figure 12B:
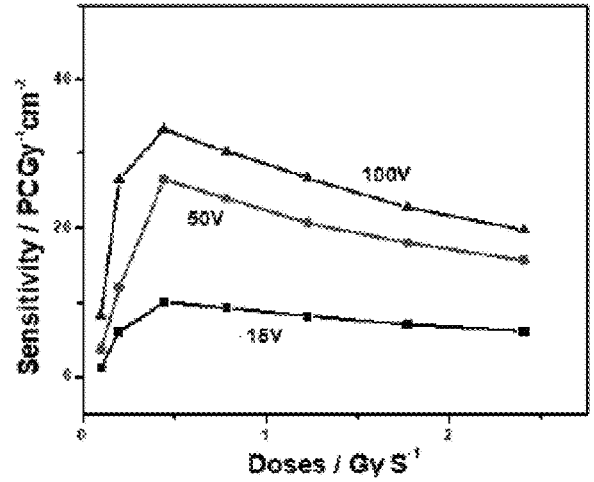

FIG. 12B is a graph of the X-ray current and dark currents measured at 15, 50, and 100 V under different doses from 0.2 to 2.4 Gy/S using the X-ray detection device fabricated with Cu/gCNs with a thickness of 100 μm.

Figure 12C:
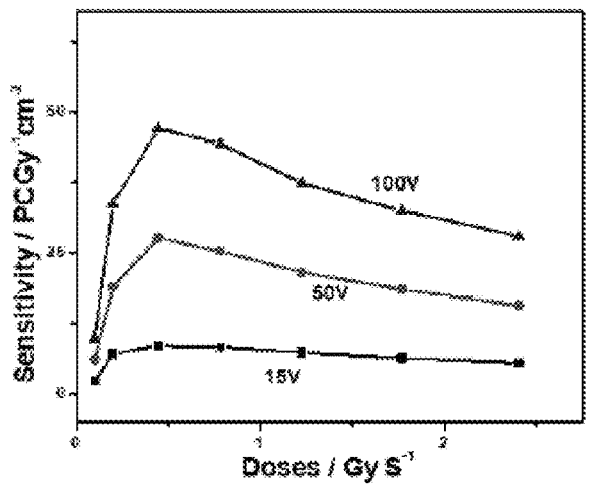

FIG. 12C is a graph of the X-ray current and dark currents measured at 15, 50, and 100 V under different doses from 0.2 to 2.4 Gy/S using the X-ray detection device fabricated with Fe/gCNs with a thickness of 100 μm.

Figure 12D:
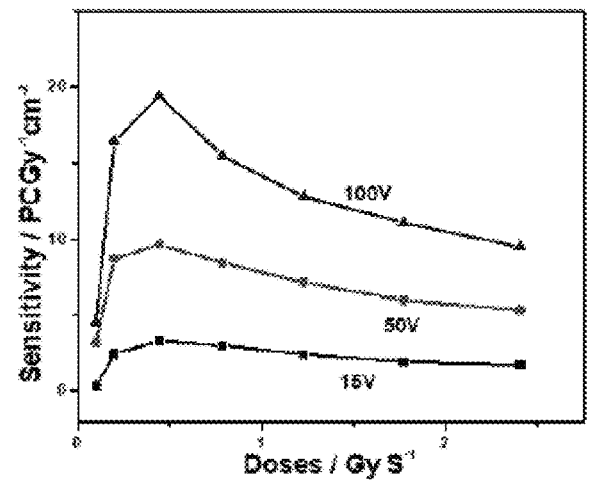

FIG. 12D is a graph of the X-ray current and dark currents measured at 15, 50, and 100 V under different doses from 0.2 to 2.4 Gy/S using the X-ray detection device fabricated with CuFe/gCNs with a thickness of 100 μm.

Figure 13A:
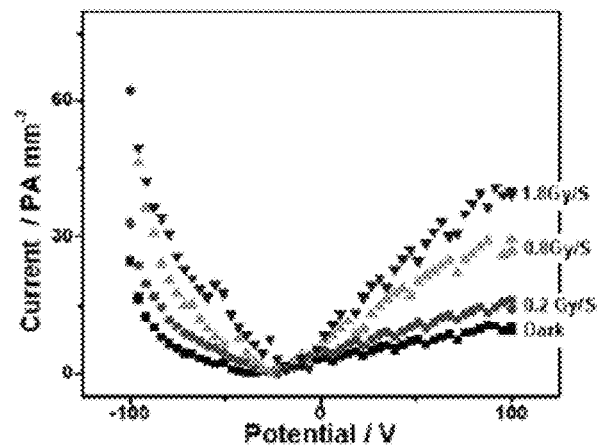

FIG. 13A is a graph of the X-ray current and dark currents measured over a potential window between −100 V and 100 V under different doses from 0.2 to 2.4 Gy/S using the X-ray detection device fabricated with gCNs with a thickness of 70 μm.

Figure 13B:
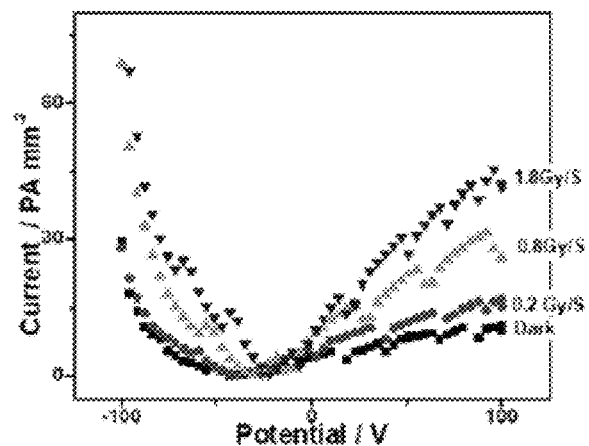

FIG. 13B is a graph of the X-ray current and dark currents measured over a potential window between −100 V and 100 V under different doses from 0.2 to 2.4 Gy/S using the X-ray detection device fabricated with Cu/gCNs with a thickness of 70 μm.

Figure 13C:
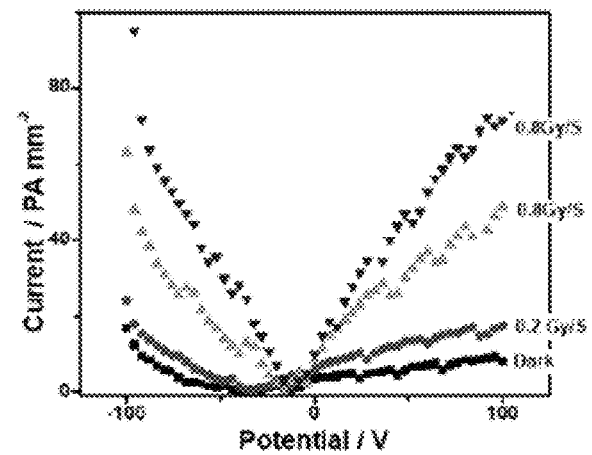

FIG. 13C is a graph of the X-ray current and dark currents measured over a potential window between −100 V and 100 V under different doses from 0.2 to 2.4 Gy/S using the X-ray detection device fabricated with Fe/gCNs with a thickness of 70 μm.

Figure 13D:
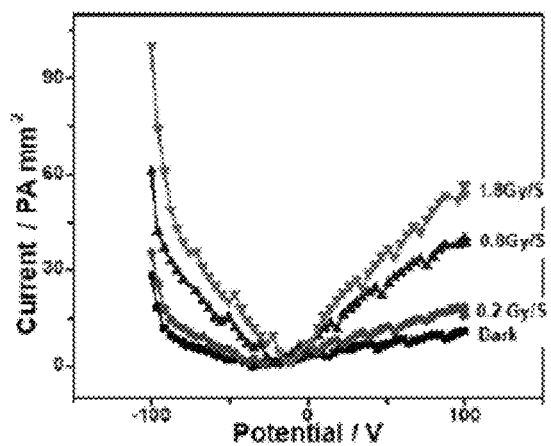

FIG. 13D is a graph of the X-ray current and dark currents measured over a potential window between −100 V and 100 V under different doses from 0.2 to 2.4 Gy/S using the X-ray detection device fabricated with CuFe/gCNs with a thickness of 70 μm.

Figure 14A:
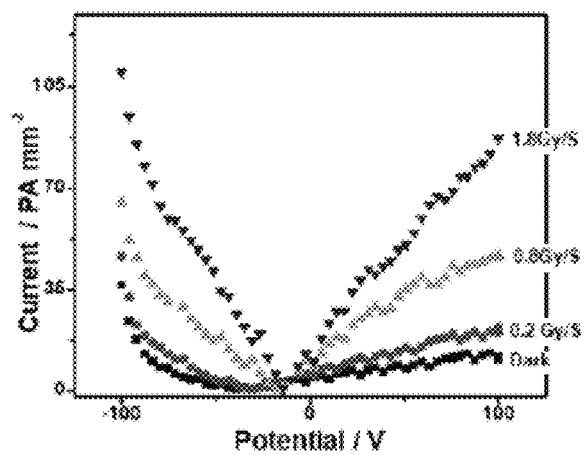

FIG. 14A is a graph of the X-ray current and dark currents measured over a potential window between −100 V and 100 V under different doses from 0.2 to 2.4 Gy/S using the X-ray detection device fabricated with gCNs with a thickness of 100 μm.

Figure 14B:
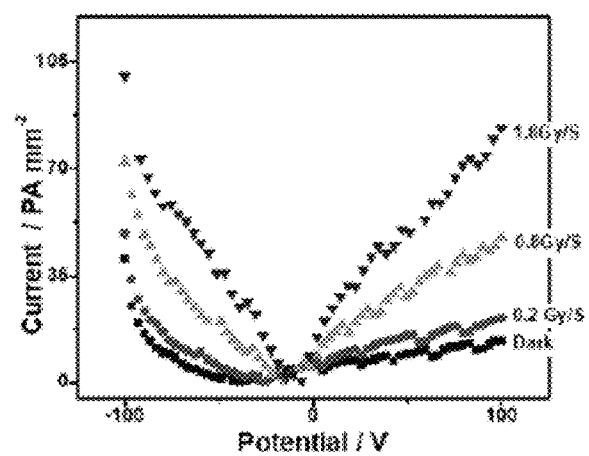

FIG. 14B is a graph of the X-ray current and dark currents measured over a potential window between −100 V and 100 V under different doses from 0.2 to 2.4 Gy/S using the X-ray detection device fabricated with Cu/gCNs with a thickness of 100 μm.

Figure 14C:
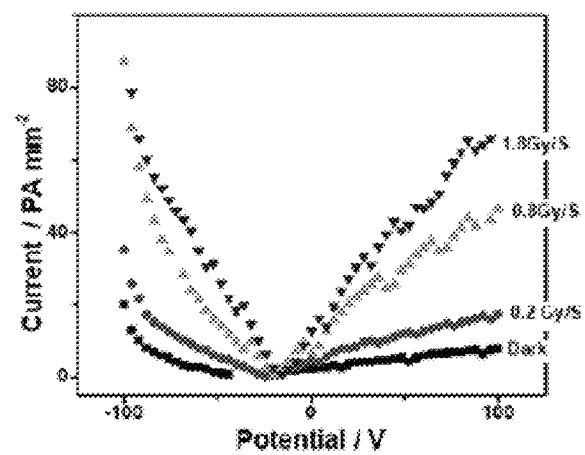

FIG. 14C is a graph of the X-ray current and dark currents measured over a potential window between −100 V and 100 V under different doses from 0.2 to 2.4 Gy/S using the X-ray detection device fabricated with Fe/gCNs with a thickness of 100 μm.

Figure 14D:
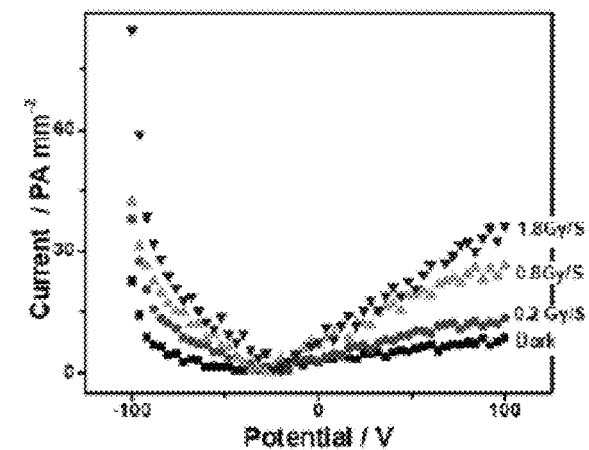

FIG. 14D is a graph of the X-ray current and dark currents measured over a potential window between −100 V and 100 V under different doses from 0.2 to 2.4 Gy/S using the X-ray detection device fabricated with CuFe/gCNs with a thickness of 100 μm.

Figure 15A:
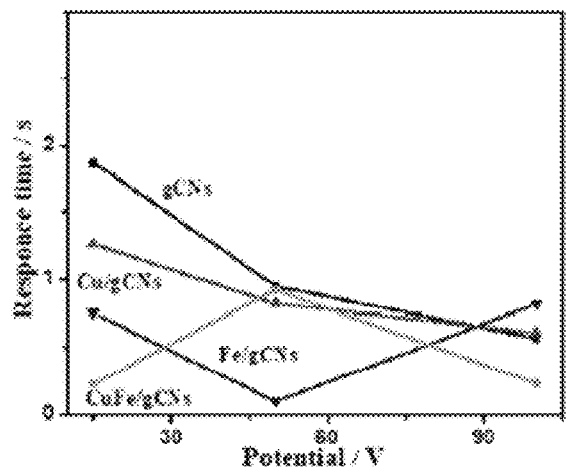

FIG. 15A is a graph comparing the X-response times measured at 15 V, 50 V, and 100 V under an X-ray dose of 0.2 Gy/S of X-ray detection devices fabricated with gCNs, Cu/gCNs, Fe/gCNs, and CuFe/gCNs with a thickness of 70 μm.

Figure 15B:
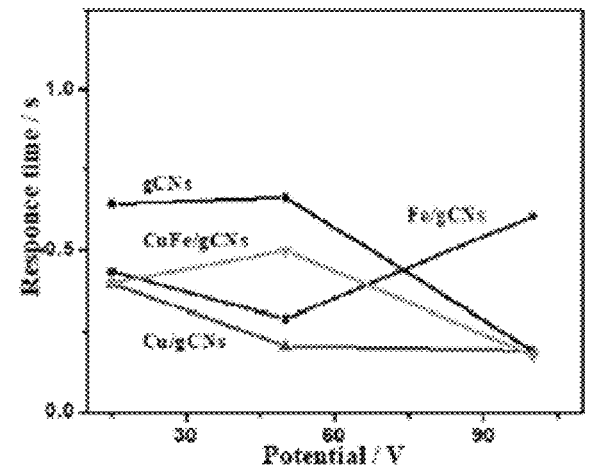

FIG. 15B is a graph comparing the X-response times measured at 15 V, 50 V, and 100 V under an X-ray dose of 2.4 Gy/S of X-ray detection devices fabricated with gCNs, Cu/gCNs, Fe/gCNs, and CuFe/gCNs with a thickness of 70 μm.

Figure 15C:
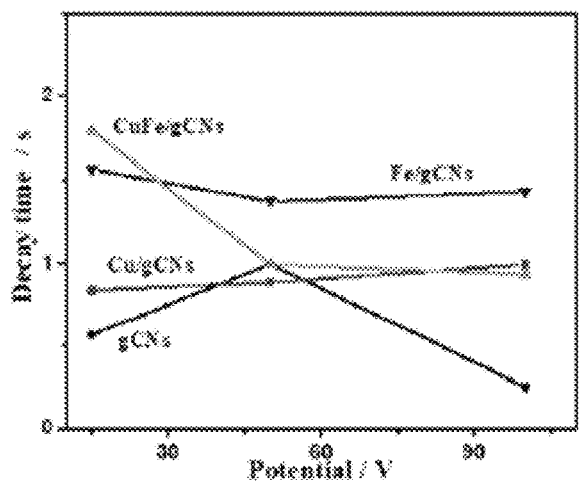

FIG. 15C is a graph comparing the X-decay times measured at 15 V, 50 V, and 100 V under an X-ray dose of 0.2 Gy/S of X-ray detection devices fabricated with gCNs, Cu/gCNs, Fe/gCNs, and CuFe/gCNs with a thickness of 70 μm.

Figure 15D:
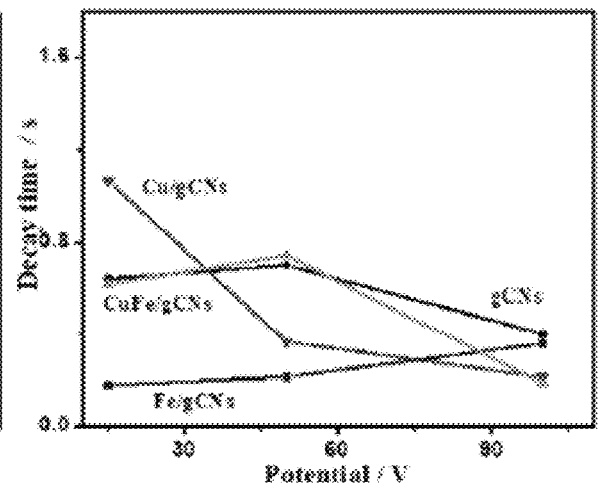

FIG. 15D is a graph comparing the X-decay times measured at 15 V, 50 V, and 100 V under an X-ray dose of 2.4 Gy/S of X-ray detection devices fabricated with gCNs, Cu/gCNs, Fe/gCNs, and CuFe/gCNs with a thickness of 70 μm.

Figure 16A:
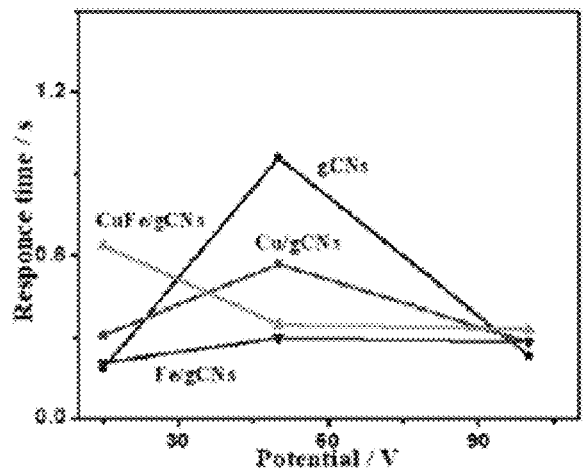

FIG. 16A is a graph comparing the X-response times measured at 15 V, 50 V, and 100 V under an X-ray dose of 0.2 Gy/S of X-ray detection devices fabricated with gCNs, Cu/gCNs, Fe/gCNs, and CuFe/gCNs with a thickness of 100 μm.

Figure 16B:
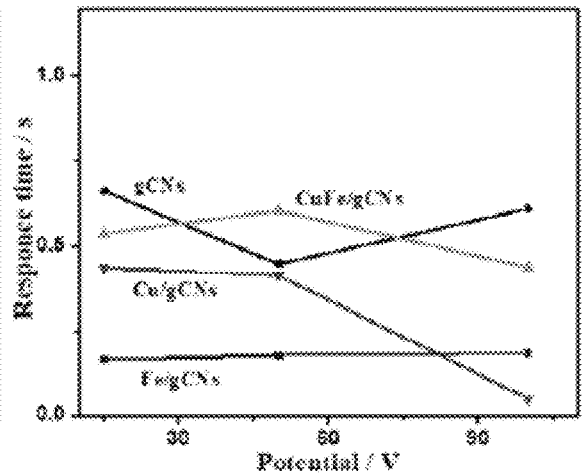

FIG. 16B is a graph comparing the X-response times measured at 15 V, 50 V, and 100 V under an X-ray dose of 2.4 Gy/S of X-ray detection devices fabricated with gCNs, Cu/gCNs, Fe/gCNs, and CuFe/gCNs with a thickness of 100 μm.

Figure 16C:
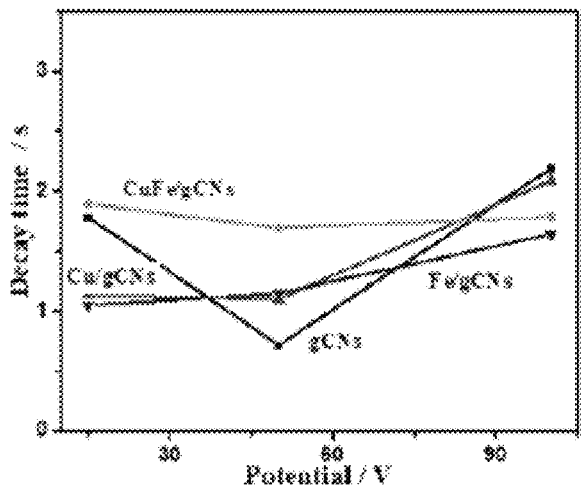

FIG. 16C is a graph comparing the X-decay times measured at 15 V, 50 V, and 100 V under an X-ray dose of 0.2 Gy/S of X-ray detection devices fabricated with gCNs, Cu/gCNs, Fe/gCNs, and CuFe/gCNs with a thickness of 100 μm.

Figure 16D:
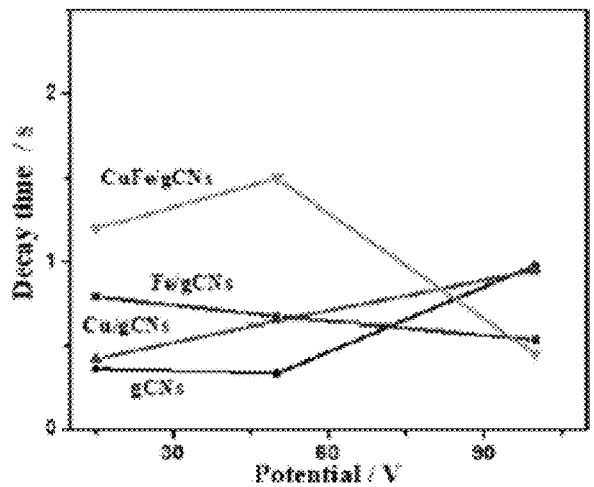

FIG. 16D is a graph comparing the X-decay times measured at 15 V, 50 V, and 100 V under an X-ray dose of 2.4 Gy/S of X-ray detection devices fabricated with gCNs, Cu/gCNs, Fe/gCNs, and CuFe/gCNs with a thickness of 100 μm.

Figure 17:
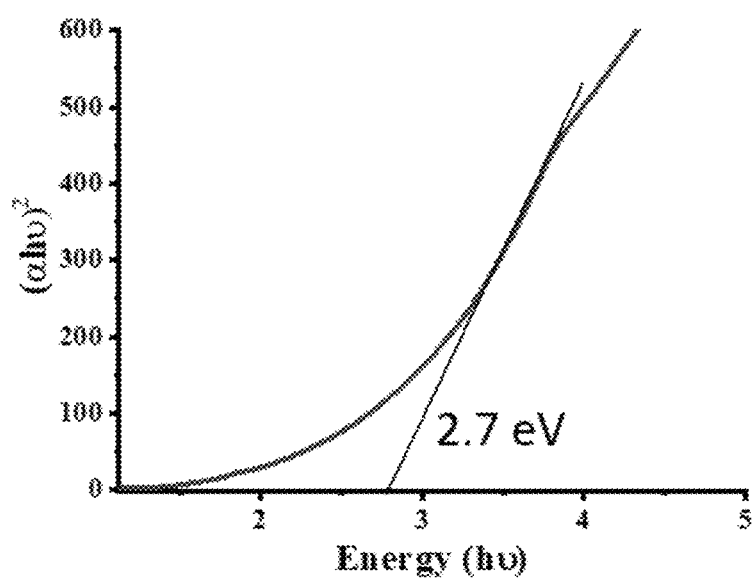

FIG. 17 is a graph showing the energy bandgap of a representative X-ray sensor comprising gCNs.

DETAILED DESCRIPTION

X-Ray Sensors Comprising gCNs

Set forth herein are X-ray sensors comprising graphitic carbon nitride materials (gCNs). In certain embodiments, the graphitic carbon nitride material (gCN) of the X-ray sensor further comprises a single metal atom selected from iron (Fe) and copper (Cu) or a combination of iron and copper.

Also described herein is the rational one-step fabrication of the gCNs for X-ray detection. In certain embodiments, the gCN is synthesized in about 100% yield. The one-step fabrication process uses earth-abundant and inexpensive resources, which helps to streamline the development process.

In one embodiment, the X-ray sensor comprises graphitic carbon nitride material (gCN). In one embodiment, the X-ray sensor comprises gCN doped with a single metal iron (Fe) atom (Fe/gCN). In one embodiment, the X-ray sensor comprises gCN doped with a single metal copper (Cu) atom (Fe/gCN). In one embodiment, the X-ray sensor comprises gCN doped with copper (Cu) and iron (Fe) (CuFe/gCN).

In one embodiment, the X-ray sensor comprises gCN, Fe/gCN, Cu/gCN, or CuFe/gCN cast in a conductive substrate, for example, a metal sheet, a solid metal oxide film, a polymer, or a hybrid material, to form the X-ray sensor. In one embodiment, the conductive substrate is glass. In one embodiment, the conductive substrate is indium tin oxide glass (ITO). Additional non-limiting examples of conductive substrates include, but are not limited to, a solid sheet of indium tin oxide (ITO) or $TiO_2$ or aluminum; a hematite sheet; a magnetite sheet; stainless-steel; solid glass; quartz; permanox; polystyrene; and "PTFE" coated, poly-L-Lysine, or silane treated slides. In an alternative embodiment, the conductive substrate is a flexible film of chitosan, polystyrene, polyvinyl acetate, poly(vinyl alcohol), poly(vinylbutyral-co-vinyl alcohol-co-vinyl acetate), polyvinyl butyral, poly (vinyl formal), or poly methyl methacrylate In one embodiment, the conductive substrate is in the shape of a square that is greater than about 1 cm×1 cm, greater than about 5 cm×5 cm, greater than about 15 cm×15 cm, greater than about 25 cm×25 cm, greater than about 40 cm×40 cm, greater than about 60 cm×60 cm, greater than about 75 cm×75 cm, greater than about 100 cm×100 cm, or greater. The conductive substrate can also be in the shape of a rectangle or square. In one embodiment, the conductive substrate is about 1 cm to 5 nm thick.

In one embodiment, the conductive substrate is ITO glass and is a square that is at least about 5 cm×5 cm. The gCN, Fe/gCN, Cu/gCN, or CuFe/gCN cast in the conductive substrate is between about 50 μM and 150 μM thick. In one embodiment, the gCN, Fe/gCN, Cu/gCN, or CuFe/gCN cast in the conductive substrate is between about 60 μM and 120 μM thick. In one embodiment, the gCN, Fe/gCN, Cu/gCN, or CuFe/gCN cast in the conductive substrate is between about 70 μM and 100 μM thick. In one embodiment, the gCN, Fe/gCN, Cu/gCN, or CuFe/gCN cast in the conductive substrate is about 70 μM thick. In one embodiment, the gCN, Fe/gCN, Cu/gCN, or CuFe/gCN cast in the conductive substrate is about 100 μM thick.

In one embodiment, the X-ray sensor comprises gCN cast in a conductive substrate of ITO glass wherein the layer of gCN is about 70 μM thick. In one embodiment, the X-ray sensor comprises Fe/gCN cast in a conductive substrate of ITO glass wherein the layer of Fe/gCN is about 70 μM thick. In one embodiment, the X-ray sensor comprises Cu/gCN cast in a conductive substrate of ITO glass wherein the layer of Cu/gCN is about 70 μM thick. In one embodiment, the X-ray sensor comprises CuFe/gCN cast in a conductive substrate of ITO glass wherein the layer of CuFe/gCN is about 70 μM thick.

In one embodiment, the X-ray sensor comprises gCN cast in a conductive substrate of ITO glass wherein the layer of gCN is about 100 μM thick. In one embodiment, the X-ray sensor comprises Fe/gCN cast in a conductive substrate of ITO glass wherein the layer of Fe/gCN is about 100 μM thick. In one embodiment, the X-ray sensor comprises Cu/gCN cast in a conductive substrate of ITO glass wherein the layer of Cu/gCN is about 100 μM thick. In one embodiment, the X-ray sensor comprises CuFe/gCN cast in a conductive substrate of ITO glass wherein the layer of CuFe/gCN is about 100 μM thick.

In one embodiment, the X-ray sensor comprises gCN, Fe/gCN, Cu/gCN, or CuFe/gCN and exhibits a quick response time of less than about 10 seconds, less than about 8 seconds, less than about 6 seconds, less than about 5 seconds, less than about 3 seconds, less than about 1 second, less than about 0.5 second, or less than about 0.1 second to X-ray doses between about 0.2-2.4 Gy/s under applied potentials between about 15 V and 100 V. In one embodiment, the X-ray dose is between about 0.2-1.0 Gy/s. In one embodiment, the X-ray dose is between about 1.0-2.4 Gy/s.

In one embodiment, the X-ray sensor comprises gCN, Fe/gCN, Cu/gCN, or CuFe/gCN and exhibits a quick decay time of less than about 10 seconds, less than about 8 seconds, less than about 6 seconds, less than about 5 seconds, less than about 3 seconds, less than about 1 second, less than about 0.5 second, or less than about 0.1 second from X-ray doses between about 0.2-2.4 Gy/s under applied potentials between about 15 V and 100 V. In one embodiment, the X-ray dose is between about 0.2-1.0 Gy/s. In one embodiment, the X-ray dose is between about 1.0-2.4 Gy/s.

In certain embodiments, the X-ray sensor comprises gCN, Fe/gCN, Cu/gCN, or CuFe/gCN and exhibits a response time of less than about 10 seconds when exposed to an X-ray dose between about 0.2-2.4 Gy/s under applied potentials between about 15 V and 100 V and a quick decay time of less than about 10 seconds. In one embodiment, the response time and the decay time are both less than about 5 seconds. In one embodiment, the response time and the decay times are both less than about 3 seconds. In one embodiment, the response time and the decay time are both less than about 1 second. In one embodiment, the X-ray dose is between about 0.2-1.0 Gy/s. In one embodiment, the X-ray dose is between about 1.0-2.4 Gy/s.

In one embodiment, the X-ray sensor is ultra-fast with a prompt quick response time of up to about 0.36 sec to an X-ray dose of 2.4 $Gys^{-1}$.

In one embodiment, the X-ray sensor comprises gCN, Fe/gCN, Cu/gCN, or CuFe/gCN and exhibits ultra-high sensitivity ranging from about 3 $PCGy^{-1}$ $cm^2$ to 30 $PCGy^{-1}$ $cm^2$ when exposed to an X-ray dose between about 0.2-2.4 Gy/s under applied potentials between about 15 V and 100 V. In one embodiment, the X-ray sensor described herein comprises gCN, Fe/gCN, Cu/gCN, or CuFe/gCN and exhibits sensitivity ranging from about 3 $PCGy^{-1}$ $cm^2$ to 8 $PCGy^{-1}$ $cm^2$, from about 8 $PCGy^{-1}$ $cm^2$ to 15 $PCGy^{-1}$ $cm^2$, or from about 15 $PCGy^{-1} cm^2$ to 30 $PCGy^{-1} cm^2$.

In any of the previous embodiments, the gCN is Cu/gCN. In any of the previous embodiments, the gCN is Fe/gCN. In any of the previous embodiments, the gCN is CuFe/gCN.

In one embodiment, the X-ray sensor comprises gCN coated on ITO glass wherein the gCN has a thickness of about 70 μM and the X-ray sensor exhibits a sensitivity of about 3 $PCy^{-1}$ $cm^2$ to about 13 $PCGy^{-1}$ $cm^2$ when exposed to an X-ray dose between about 0.2-2.4 Gy/s under applied potentials between about 15 V and 100 V. In one embodiment, the sensitivity is less than about 5.0 $PCGy^{-1}$ $cm^2$ when exposed to an X-ray dose between about 0.2-2.4 Gy/s under an applied potential of 15 V. In one embodiment, the sensitivity is less than about 5.0 $PCGy^{-1} cm^2$ when exposed to an X-ray dose of about 2.4 Gy/s under an applied potential of 15 V. In one embodiment, the sensitivity is less than about 15 PCGy$^{-1}$cm$^2$ when exposed to an X-ray dose between about 0.2-2.4 Gy/s under an applied potential of 50 V. In one embodiment, the sensitivity is less than about 10 PCGy$^{-1}$ cm$^2$ when exposed to an X-ray dose of about 2.4 Gy/s under an applied potential of 50 V. In one embodiment, the sensitivity is less than about 30 PCGy$^{-1}$ cm$^2$ when exposed to an X-ray dose between about 0.2-2.4 Gy/s under an applied potential of 100 V. In one embodiment, the sensitivity is less than about 15 PCGy$^{-1}$cm$^2$ when exposed to an X-ray dose of about 2.4 Gy/s under an applied potential of 100 V.

In one embodiment, the X-ray sensor comprises gCN coated on ITO glass wherein the gCN has a thickness of about 100 μM and the X-ray sensor exhibits a sensitivity of about 6 PCy$^{-1}$ cm$^2$ to about 31 PCGy$^{-1}$ cm$^2$ when exposed to an X-ray dose between about 0.2-2.4 Gy/s under applied potentials between about 15 V and 100 V. In one embodiment, the sensitivity is less than about 10 PCGy$^{-1}$cm$^2$ when exposed to an X-ray dose between about 0.2-2.4 Gy/s under an applied potential of 15 V. In one embodiment, the sensitivity is less than about 10 PCGy$^{-1}$cm$^2$ when exposed to an X-ray dose of about 2.4 Gy/s under an applied potential of 15 V. In one embodiment, the sensitivity is less than about 30 PCGy$^{-1}$ cm$^2$ when exposed to an X-ray dose between about 0.2-2.4 Gy/s under an applied potential of 50 V. In one embodiment, the sensitivity is less than about 20 PCGy$^{-1}$ cm$^2$ when exposed to an X-ray dose of about 2.4 Gy/s under an applied potential of 50 V. In one embodiment, the sensitivity is less than about 60 PCGy$^{-1}$ cm$^2$ when exposed to an X-ray dose between about 0.2-2.4 Gy/s under an applied potential of 100 V. In one embodiment, the sensitivity is less than about 35 PCGy$^{-1}$cm$^2$ when exposed to an X-ray dose of about 2.4 Gy/s under an applied potential of 100 V.

In one embodiment, the X-ray sensor comprises Cu/gCN coated on ITO glass wherein the Cu/gCN has a thickness of about 70 μM and the X-ray sensor exhibits a sensitivity of about 7 PCGy$^{-1}$cm$^2$ to about 30 PCGy$^{-1}$cm$^2$ when exposed to an X-ray dose between about 0.2-2.4 Gy/s under applied potentials between about 15 V and 100 V. In one embodiment, the sensitivity is less than about 15 PCGy$^{-1}$cm$^2$ when exposed to an X-ray dose between about 0.2-2.4 Gy/s under an applied potential of 15 V. In one embodiment, the sensitivity is less than about 15 PCGy$^{-1}$cm$^2$ when exposed to an X-ray dose of about 2.4 Gy/s under an applied potential of 15 V. In one embodiment, the sensitivity is less than about 30 PCGy$^{-1}$cm$^2$ when exposed to an X-ray dose between about 0.2-2.4 Gy/s under an applied potential of 50 V. In one embodiment, the sensitivity is less than about 25 PCGy$^{-1}$ cm$^2$ when exposed to an X-ray dose of about 2.4 Gy/s under an applied potential of 50 V. In one embodiment, the sensitivity is less than about 50 PCGy$^{-1}$ cm$^2$ when exposed to an X-ray dose between about 0.2-2.4 Gy/s under an applied potential of 100 V. In one embodiment, the sensitivity is less than about 35 PCGy$^{-1}$cm$^2$ when exposed to an X-ray dose of about 2.4 Gy/s under an applied potential of 100 V.

In one embodiment, the X-ray sensor comprises Cu/gCN coated on ITO glass wherein the Cu/gCN has a thickness of about 100 μM and the X-ray sensor exhibits a sensitivity of about 6 PCGy$^{-1}$cm$^2$ to about 20 PCGy$^{-1}$cm$^2$ when exposed to an X-ray dose between about 0.2-2.4 Gy/s under applied potentials between about 15 V and 100 V. In one embodiment, the sensitivity is less than about 20 PCGy$^{-1}$cm$^2$ when exposed to an X-ray dose between about 0.2-2.4 Gy/s under an applied potential of 15 V. In one embodiment, the sensitivity is less than about 15 PCGy$^{-1}$cm$^2$ when exposed to an X-ray dose of about 2.4 Gy/s under an applied potential of 15 V. In one embodiment, the sensitivity is less than about 30 PCGy$^{-1}$cm$^2$ when exposed to an X-ray dose between about 0.2-2.4 Gy/s under an applied potential of 50 V. In one embodiment, the sensitivity is less than about 20 PCGy$^{-1}$ cm$^2$ when exposed to an X-ray dose of about 2.4 Gy/s under an applied potential of 50 V. In one embodiment, the sensitivity is less than about 40 PCGy$^{-1}$ cm$^2$ when exposed to an X-ray dose between about 0.2-2.4 Gy/s under an applied potential of 100 V. In one embodiment, the sensitivity is less than about 25 PCGy$^{-1}$cm$^2$ when exposed to an X-ray dose of about 2.4 Gy/s under an applied potential of 100 V.

In one embodiment, the X-ray sensor comprises Fe/gCN coated on ITO glass wherein the Fe/gCN has a thickness of about 70 μM and the X-ray sensor exhibits a sensitivity of about 7 PCGy$^{-1}$cm$^2$ to about 30 PCGy$^{-1}$cm$^2$ when exposed to an X-ray dose between about 0.2-2.4 Gy/s under applied potentials between about 15 V and 100 V. In one embodiment, the sensitivity is less than about 15.0 PCGy$^{-1}$cm$^2$ when exposed to an X-ray dose between about 0.2-2.4 Gy/s under an applied potential of 15 V. In one embodiment, the sensitivity is less than about 15 PCGy$^{-1}$cm$^2$ when exposed to an X-ray dose of about 2.4 Gy/s under an applied potential of 15 V. In one embodiment, the sensitivity is less than about 30 PCGy$^{-1}$cm$^2$ when exposed to an X-ray dose between about 0.2-2.4 Gy/s under an applied potential of 50 V. In one embodiment, the sensitivity is less than about 25 PCGy$^{-1}$ cm$^2$ when exposed to an X-ray dose of about 2.4 Gy/s under an applied potential of 50 V. In one embodiment, the sensitivity is less than about 60.0 PCGy$^{-1}$ cm$^2$ when exposed to an X-ray dose between about 0.2-2.4 Gy/s under an applied potential of 100 V. In one embodiment, the sensitivity is less than about 35 PCGy$^{-1}$cm$^2$ when exposed to an X-ray dose of about 2.4 Gy/s under an applied potential of 100 V.

In one embodiment, the X-ray sensor comprises Fe/gCN coated on ITO glass wherein the Fe/gCN has a thickness of about 100 μM and the X-ray sensor exhibits a sensitivity of about 7 PCGy$^{-1}$cm$^2$ to about 30 PCGy$^{-1}$cm$^2$ when exposed to an X-ray dose between about 0.2-2.4 Gy/s under applied potentials between about 15 V and 100 V. In one embodiment, the sensitivity is less than about 15 PCGy$^{-1}$cm$^2$ when exposed to an X-ray dose between about 0.2-2.4 Gy/s under an applied potential of 15 V. In one embodiment, the sensitivity is less than about 15 PCGy$^{-1}$cm$^2$ when exposed to an X-ray dose of about 2.4 Gy/s under an applied potential of 15 V. In one embodiment, the sensitivity is less than about 30 PCGy$^{-1}$cm$^2$ when exposed to an X-ray dose between about 0.2-2.4 Gy/s under an applied potential of 50 V. In one embodiment, the sensitivity is less than about 25 PCGy$^{-1}$ cm$^2$ when exposed to an X-ray dose of about 2.4 Gy/s under an applied potential of 50 V. In one embodiment, the sensitivity is less than about 40 PCGy$^{-1}$ cm$^2$ when exposed to an X-ray dose between about 0.2-2.4 Gy/s under an applied potential of 100 V. In one embodiment, the sensitivity is less than about 30 PCGy$^{-1}$ cm$^2$ when exposed to an X-ray dose of about 2.4 Gy/s under an applied potential of 100 V.

In one embodiment, the X-ray sensor comprises CuFe/gCN coated on ITO glass wherein the CuFe/gCN has a thickness of about 70 μM and the X-ray sensor exhibits a sensitivity of about 4 PCGy$^{-1}$cm$^2$ to about 20 PCGy$^{-1}$cm$^2$ when exposed to an X-ray dose between about 0.2-2.4 Gy/s under applied potentials between about 15 V and 100 V. In one embodiment, the sensitivity is less than about 10 $PCGy^{-1}cm^2$ when exposed to an X-ray dose between about 0.2-2.4 Gy/s under an applied potential of 15 V. In one embodiment, the sensitivity is less than about 10 $PCGy^{-1}cm^2$ when exposed to an X-ray dose of about 2.4 Gy/s under an applied potential of 15 V. In one embodiment, the sensitivity is less than about 20 $PCGy^{-1}cm^2$ when exposed to an X-ray dose between about 0.2-2.4 Gy/s under an applied potential of 50 V. In one embodiment, the sensitivity is less than about 20 $PCGy^{-1}$ $cm^2$ when exposed to an X-ray dose of about 2.4 Gy/s under an applied potential of 50 V. In one embodiment, the sensitivity is less than about 44 $PCGy^{-1}$ $cm^2$ when exposed to an X-ray dose between about 0.2-2.4 Gy/s under an applied potential of 100 V. In one embodiment, the sensitivity is less than about 30 $PCGy^{-1}cm^2$ when exposed to an X-ray dose of about 2.4 Gy/s under an applied potential of 100 V.

In one embodiment, the X-ray sensor comprises CuFe/gCN coated on ITO glass wherein the CuFe/gCN has a thickness of about 100 μM and the X-ray sensor exhibits a sensitivity of about 2 $PCGy^{-1}cm^2$ to about 10 $PCGy^{-1}cm^2$ when exposed to an X-ray dose between about 0.2-2.4 Gy/s under applied potentials between about 15 V and 100 V. In one embodiment, the sensitivity is less than about 5 $PCGy^{-1}cm^2$ when exposed to an X-ray dose between about 0.2-2.4 Gy/s under an applied potential of 15 V. In one embodiment, the sensitivity is less than about 5 $PCGy^{-1}$ $cm^2$ when exposed to an X-ray dose of about 2.4 Gy/s under an applied potential of 15 V. In one embodiment, the sensitivity is less than about 10 $PCGy^{-1}cm^2$ when exposed to an X-ray dose between about 0.2-2.4 Gy/s under an applied potential of 50 V. In one embodiment, the sensitivity is less than about 1-$PCGy^{-1}cm^2$ when exposed to an X-ray dose of about 2.4 Gy/s under an applied potential of 50 V. In one embodiment, the sensitivity is less than about 20 $PCGy^{-1}$ $cm^2$ when exposed to an X-ray dose between about 0.2-2.4 Gy/s under an applied potential of 100 V. In one embodiment, the sensitivity is less than about 15 $PCGy^{-1}cm^2$ when exposed to an X-ray dose of about 2.4 Gy/s under an applied potential of 100 V.

In one embodiment, the X-ray sensors described herein are characterized by low dark currents. In one embodiment, the X-ray sensor comprises gCN coated on ITO glass wherein the gCN has a thickness of about 100 μM and the X-ray sensor exhibits is characterized by a dark current in the range of about 10 PA $mm^{-2}$ to about 25 PA $mm^{-2}$ over a potential window between −100 V and 100 V. In one embodiment, the X-ray sensor comprises Cu/gCN coated on ITO glass wherein the Cu/gCN has a thickness of about 100 μM and the X-ray sensor exhibits is characterized by a dark current in the range of about 10 PA $mm^{-2}$ to about 30 PA $mm^{-2}$ over a potential window between −100 V and 100 V. In one embodiment, the X-ray sensor comprises Fe/gCN coated on ITO glass wherein the Fe/gCN has a thickness of about 100 μM and the X-ray sensor is characterized by a dark current in the range of about 9 PA $mm^{-2}$ to about 17 PA $mm^{-2}$ over a potential window between −100 V and 100 V. In one embodiment, the X-ray sensor comprises CuFe/gCN coated on ITO glass wherein the CuFe/gCN has a thickness of about 100 μM and the X-ray sensor exhibits is characterized by a dark current in the range of about 10 PA $mm^{-2}$ to about 30 PA $mm^{-2}$ over a potential window between −100 V and 100 V.

In one embodiment, the X-ray sensor comprises gCN, Cu/gCN, Fe/gCN, or CuFe/gCN and is characterized by a rapid response time between about 0.2-2.15 seconds and a sensitivity between about 3.2-10.35 $PCGy^{-1}cm^2$ when exposed to an X-ray dose of 0.2 $Gys^{-1}$ and an applied potential of 15 V.

In one embodiment, the X-ray sensor comprises gCN, Cu/gCN, Fe/gCN, or CuFe/gCN and is characterized by a) a rapid response time between about 0.2-2.15 seconds and a sensitivity between about 3.2-10.35 $PCGy^{-1}cm^2$ when exposed to an X-ray dose of 0.2 $Gys^{-1}$ and an applied potential of 15 V and b) a dark current at zero dose of less than about 1.0 PA $mm^2$ under an applied voltage of 15 V.

In one embodiment, the X-ray sensor comprises gCN cast on a surface of ITO glass wherein the X-ray sensor is characterized by a rapid response time of less than about 0.5 seconds and a sensitivity between about 3-11 $PCGy^{-1}cm^2$ when exposed to an X-ray dose of 0.2 $Gys^{-1}$ and an applied potential of 15 V. In one embodiment, the X-ray sensor comprising gCN is further characterized by a dark current at zero dose of about 0.7-0.8 PA $mm^2$ under an applied voltage of 15 V.

In one embodiment, the X-ray sensor comprises Cu/gCN cast on a surface of ITO glass wherein the X-ray sensor is characterized by a rapid response time of less than about 1 second and a sensitivity between about 8-11 $PCGy^{-1}cm^2$ when exposed to an X-ray dose of 0.2 $Gys^{-1}$ and an applied potential of 15 V. In one embodiment, the X-ray sensor comprising Cu/gCN is further characterized by a dark current at zero dose of about 0.6-0.7 PA $mm^2$ under an applied voltage of 15 V.

In one embodiment, the X-ray sensor comprises Fe/gCN cast on a surface of ITO glass wherein the X-ray sensor is characterized by a rapid response time of less than about 2.5 seconds and a sensitivity between about 8-10 $PCGy^{-1}$ $cm^2$ when exposed to an X-ray dose of 0.2 $Gys^{-1}$ and an applied potential of 15 V. In one embodiment, the X-ray sensor comprising Fe/gCN is further characterized by a dark current at zero dose of about 0.5 PA $mm^2$ under an applied voltage of 15 V.

In one embodiment, the X-ray sensor comprises CuFe/gCN cast on a surface of ITO glass wherein the X-ray sensor is characterized by a rapid response time of less than about 0.5 seconds and a sensitivity between about 2-7 $PCGy^{-1}$ $cm^2$ when exposed to an X-ray dose of 0.2 $Gys^{-1}$ and an applied potential of 15 V. In one embodiment, the X-ray sensor comprising gCN is further characterized by a dark current at zero dose of about 0.5 PA $mm^2$ under an applied voltage of 15 V.

In one embodiment, the X-ray sensor comprises gCN cast on a surface of ITO glass wherein the layer of gCN is about 70 μM thick and the X-ray sensor is characterized by a rapid response time of less than 1 second and a sensitivity of less than 15 $PCGy^{-1}$ $cm^2$ when exposed to an X-ray dose of 2.4 $Gys^{-1}$ and an applied potential between 15 V and 100 V.

In one embodiment, the X-ray sensor comprises gCN cast on a surface of ITO glass wherein the layer of gCN is about 100 μM thick and the X-ray sensor is characterized by a rapid response time of less than 1 second and a sensitivity of less than 38 $PCGy^{-1}$ $cm^2$ when exposed to an X-ray dose of 2.4 $Gys^{-1}$ and an applied potential between 15 V and 100 V.

In one embodiment, the X-ray sensor comprises Cu/gCN cast on a surface of ITO glass wherein the layer of Cu/gCN is about 70 μM thick and the X-ray sensor is characterized by a rapid response time of less than 1 second and a sensitivity of less than 30 $PCGy^{-1}$ $cm^2$ when exposed to an X-ray dose of 2.4 $Gys^{-1}$ and an applied potential between 15 V and 100 V.

In one embodiment, the X-ray sensor comprises Cu/gCN cast on a surface of ITO glass wherein the layer of Cu/gCN is about 100 μM thick and the X-ray sensor is characterized by a rapid response time of less than 1 second and a sensitivity of less than 30 PCGy$^{-1}$ cm$^2$ when exposed to an X-ray dose of 2.4 Gys$^{-1}$ and an applied potential between 15 V and 100 V.

In one embodiment, the X-ray sensor comprises Fe/gCN cast on a surface of ITO glass wherein the layer of Fe/gCN is about 70 μM thick and the X-ray sensor is characterized by a rapid response time of less than 1 second and a sensitivity of less than 40 PCGy$^{-1}$ cm$^2$ when exposed to an X-ray dose of 2.4 Gys$^{-1}$ and an applied potential between 15 V and 100 V.

In one embodiment, the X-ray sensor comprises Fe/gCN cast on a surface of ITO glass wherein the layer of Fe/gCN is about 100 μM thick and the X-ray sensor is characterized by a rapid response time of less than 1 second and a sensitivity of less than 30 PCGy$^{-1}$ cm$^2$ when exposed to an X-ray dose of 2.4 Gys$^{-1}$ and an applied potential between 15 V and 100 V.

In one embodiment, the X-ray sensor comprises CuFe/gCN cast on a surface of ITO glass wherein the layer of CuFe/gCN is about 70 μM thick and the X-ray sensor is characterized by a rapid response time of less than 1 second and a sensitivity of less than 30 PCGy$^{-1}$cm$^2$ when exposed to an X-ray dose of 2.4 Gys$^{-1}$ and an applied potential between 15 V and 100 V.

In one embodiment, the X-ray sensor comprises CuFe/gCN cast on a surface of ITO glass wherein the layer of CuFe/gCN is about 100 μM thick and the X-ray sensor is characterized by a rapid response time of less than 1 second and a sensitivity of less than 15 PCGy$^{-1}$cm$^2$ when exposed to an X-ray dose of 2.4 Gys$^{-1}$ and an applied potential between 15 V and 100 V.

In one embodiment, the X-ray sensor comprises gCN, Cu/gCN, Fe/gCN, or CuFe/gCN and is characterized by a dark current at zero dose of less than 1.0 PA mm$^2$, less than about 0.9 PA mm$^2$, less than about 0.8 PA mm$^2$, less than about 0.7 PA mm$^2$, less than about 0.6 PA mm$^2$, less than about 0.5 PA mm$^2$, or less than about 0.4 PA mm$^2$ under an applied voltage of 15 V.

In one embodiment, the X-ray sensor comprises gCN, Cu/gCN, Fe/gCN, or CuFe/gCN and is characterized by a dark current at zero dose of about 1.0 PA mm$^2$-0.4 PA mm$^2$ under an applied voltage of 15 V. In one embodiment, the X-ray sensor comprises gCN, Cu/gCN, Fe/gCN, or CuFe/gCN and is characterized by a dark current at zero dose of about 0.8 PA mm$^2$-0.42 PA mm$^2$ under an applied voltage of 15 V.

In one embodiment, the X-ray sensor described herein is characterized by ultra-high sensitivity (0.1-1000.35 sPCGy$^-$1cm$^{-2}$), low operational voltages, wide broad energy ranges (5-150 V), quick responses (0.1-60 sec), low dark current (0.05-50 PA mm$^2$), and dose rate of 0.01 to 40 Gy s$^{-1}$ for X-ray detection.

In an alternative embodiment, the carbon nitride is mixed with an organic bulk heterojunction matrix consisting of poly(3-hexythiophene) (P3HT) and [6,6]-phenyl-C71-butyric acid methyl ester (PCBM) or 6,13-bis-(triisopropylsilylethynyl)pentacene system. In an alternative embodiment, the carbon nitride is mixed with an organic bulk heterojunction matrix consisting of poly(3-hexythiophene) (P3HT) and [6,6]-phenyl-C71-butyric acid methyl ester (PCBM) or 6,13-bis-(triisopropylsilylethynyl)pentacene system for enabling X-ray imaging with poly(3,4-ethylenedioxythiophene): poly(styrene sulfonate) (PEDOT:PSS) as the hole transport layer (HTL)

In an alternative embodiment, the carbon nitride is mixed with a metal, for example a noble-metal or a transition metals, in the form of atomic doping. In an alternative embodiment, the carbon nitride is mixed with a metal, for examples a noble-metal or a transition metal, in the form of a single atom. In an alternative embodiment, the carbon nitride is mixed with a metal, for examples a noble-metal or a transition metal, or an oxide thereof in the form of a single site. In an alternative embodiment, the carbon nitride is mixed with s quantum dot in the form of a single atom. In an alternative embodiment, the carbon nitride is mixed with quantum dots in the form of atomic doping. In an alternative embodiment, the carbon nitride is mixed with quantum dots in the form of single sites.

The gCN-based X-ray sensors described herein can be used for the detection of X-ray at room temperature, in air, and/or over wide broad energy ranges (15-100 V). In one embodiment, the sensor is used for the X-ray detection of solid samples. In one embodiment, the sensor is used for the X-ray detection of liquid samples. In alternative embodiments, the sensors are used for the detection of electromagnetic radiation or waves (radio waves, microwaves, infrared, (visible) light, ultraviolet, and gamma rays).

Methods of Producing gCNs and X-Ray Sensors Comprising gCNs

The gCNs described herein can be produced in a one-step process from inexpensive and earth-abundant materials to afford the gCN in a high yield. In one embodiment, the process for forming the gCNs described herein includes:

(a) adding an amine selected from melamine, urea, cyanuric acid, and pyridine to a solution of alcohol and adding acid;

(b) stirring the mixture at room temperature to form a precipitate;

(c) washing the precipitate and drying the precipitate at approximately 50-150° C. for at least 12 hours; and (d) annealing the precipitate at approximately 450-550° C. for at least 2 hours.

In certain embodiments, the solution of alcohol in step (a) further comprises CuCl$_2$·2H$_2$O or FeCl$_3$·6H$_2$O or a mixture of CuCl$_2$·2H$_2$O and FeCl$_3$·6H$_2$O. In one embodiment, the alcohol further comprises CuCl$_2$·2H$_2$O or FeCl$_3$·6H$_2$O. In one embodiment, the alcohol further comprises CuCl$_2$·2H$_2$O and FeCl$_3$·6H$_2$O. In one embodiment, the alcohol is ethanol and the solution of alcohol further comprises CuCl$_2$·2H$_2$O. In one embodiment, the alcohol is ethanol and the solution of alcohol further comprises FeCl$_3$·6H$_2$O. In one embodiment, the alcohol is ethanol and the solution of alcohol further comprises FeCl$_3$·6H$_2$O and CuCl$_2$·2H$_2$O.

In one embodiment, the alcohol is selected from methanol, ethylene glycol, glycerol, ethanol, propanol, and isopropanol. In one embodiment, the alcohol is methanol. In one embodiment, the alcohol is ethanol.

In one embodiment, the amine in step (a) is melamine. In one embodiment, the alcohol from step (a) is ethanol. In one embodiment, the concentration of melamine in the ethanol solution is at least about 0.1 molar, at least about 0.15 molar, at least about 0.2 molar, at least about 0.25 molar, or at least about 0.3 molar.

In certain embodiments, the acid is H$_2$SO$_4$, HClO$_4$, or HNO$_3$. In certain embodiments, the concentration of the acid is from about 0.1 M to about 1 M. In one embodiment, the concentration of the acid is about 0.1 M. In one embodiment, the acid is HNO$_3$. In one embodiment, the acid is HNO$_3$ and the concentration is about 0.1 M.

In certain embodiments, the mixture is stirred at room temperature in step (b) for at least 15 minutes, at least 30 minutes, at least 45 minutes, at least 1 hour, at least 2 hours, at least 3 hours, at last 4 hours, or more. In one embodiment, the mixture is stirred for at least 1 hour. In one embodiment, the mixture is stirred for at least 30 minutes.

In certain embodiments, the precipitate is dried at approximately 60° C.-120° C., 70° C.-110° C., or 80° C.-100° C. in step (c). In certain embodiments, the precipitate is dried at approximately 70° C.-90° C. In certain embodiments, the precipitate is dried at approximately 80° C.

In certain embodiments, the precipitate is annealed at approximately 450° C., 500° C., or 550° C. In certain embodiments, the precipitate is annealed at approximately 450° C.

In one embodiment, the process for forming the gCNs described herein includes:
- (a) adding melamine to ethanol and adding $HNO_3$;
- (b) stirring the mixture at room temperature to form a precipitate;
- (c) washing the precipitate and drying the precipitate at approximately 80° C. for at least 12 hours; and
- (d) annealing the precipitate at approximately 450° C. for at least 2 hours.

The X-ray sensors described herein comprising the gCNs can be produced using a casting methods that comprises the following additional steps:
- (e) dispersing the carbon nitride from step (d) above in a solution of polymer and alcohol;
- (f) casting the solution of carbon nitride dispersed in the polymer/alcohol solution into a conductive substrate to form a membrane;
- (g) drying the membrane to evaporate the solvent;
- (h) painting silver paste on the membrane; and
- (i) attaching two wires to the membrane to afford the X-ray sensor.

In one embodiment, the polymer is selected from polyvinyl acetate, poly(vinyl alcohol), poly(vinylbutyral-co-vinyl alcohol-co-vinyl acetate), polyvinyl butyral, poly (vinyl formal), or poly methyl methacrylate. In one embodiment, the alcohol in step (e) is selected from ethanol, methanol, propanol, isopropanol, glycerol, and ethylene glycol. In one embodiment, the alcohol in step (e) is methanol. In one embodiment, the polymer is polyvinyl acetate and the alcohol in step (d) is methanol.

In one embodiment, the polymer is polyvinyl acetate. In one embodiment, the conductive substrate is a solid sheet of indium tin oxide (ITO) or $TiO_2$ or aluminum; a hematite sheet, a magnetite sheet, or stainless-steel. In one embodiment the conductive substrate is indium tin oxide (ITO).

Further provided herein is an X-ray sensor produced according to steps (a)-(i) described above.

The terms "a" and "an" as used herein do not denote a limitation of quantity, but rather denote the presence of at least one of the referenced item. The term "or" means "and/or". Recitation of ranges of values merely intend to serve as a shorthand method of referring individually to each separate value falling within the range, unless otherwise indicated herein, and each separate value is incorporated into the specification as if it were individually recited herein. The endpoints of all ranges are included within the range and independently combinable. All processes described herein can be performed in a suitable order unless otherwise indicated herein or otherwise clearly contradicted by context. The use of example, or exemplary language (e.g., "such as"), is intended merely to better illustrate the invention and does not pose a limitation on the scope of the invention on unless otherwise claimed.

EXAMPLES

Materials

Iron (III) chloride hexahydrate ($FeCl_3$ $6H_2O$, 99.99%), copper chloride (II) ($CuCl_2 \cdot 2H_2O$, 99.99%), melamine (99%), ethanol (99.8%), polyvinyl acetate (Mwt. 51000), methanol (anhydrous, 99.8%) and nitric acid (70%) were obtained from Sigma-Aldrich Chemie GmbH (Munich, Germany). Indium tin oxide slides (1.5×1.5 cm, thickness 185 nm, 10Ω) and silver paste were purchased from AliExpress.

Synthesis of Porous Carbon Nitride (gCNs)

Melamine (1 g) was slowly added to 30 mL of an ethanol solution, followed by the dropwise addition of 70 mL of HNO3 (0.1 M). The mixture was stirred at room temperature for 30 minutes and a yellowish precipitate formed. This precipitate was washed with ethanol and dried at 80° C. for 12 hours prior to annealing at 450° C. (3°/min) for 2 hours. After cooling to room temperature, the final product (1 g) was saved for further characterization.

Synthesis of Porous Carbon Nitride with Copper (Cu/gCNs)

Melamine (1 g) was slowly added to 30 mL of an ethanol solution containing 1 mL of $CuCl_2 \cdot 2H_2O$ (20 mM), followed by the dropwise addition of 70 mL of $HNO_3$ (0.1 M). The mixture was stirred at room temperature for 30 minutes and a yellowish precipitate formed. This precipitate was washed with ethanol and dried at 80° C. for 12 hours prior to annealing at 450° C. (3°/min) for 2 hours. After cooling to room temperature, the final product was saved for further characterization.

Synthesis of Porous Carbon Nitride with Iron (Fe/gCNs)

Melamine (1 g) was slowly added to 30 mL of an ethanol solution containing 1 mL of $FeCl_3 \cdot 6H_2O$ (20 mM), followed by the dropwise addition of 70 mL of $HNO_3$ (0.1 M). The mixture was stirred at room temperature for 30 minutes and a yellowish precipitate formed. This precipitate was washed with ethanol and dried at 80° C. for 12 hours prior to annealing at 450° C. (3°/min) for 2 hours. After cooling to room temperature, the final product was saved for further characterization.

Synthesis of Porous Carbon Nitride (gCNs) with Copper and Iron (CuFe/gCNs)

Melamine (1 g) was slowly added to 30 mL of an ethanol solution containing 1 mL of $CuCl_2 \cdot 2H_2O$ (20 mM) and 1 mL of $FeCl_3 \cdot 6H_2O$ (20 mM) followed by the dropwise addition of 70 mL of $HNO_3$ (0.1 M). The mixture was stirred at room temperature for 30 minutes and a yellowish precipitate formed. This precipitate was washed with ethanol and dried at 80° C. for 12 hours prior to annealing at 450° C. (3°/min) for 2 hours. After cooling to room temperature, the final product was saved for further characterization.

Characterization

The materials were characterized using a scanning electron microscope (SEM, Hitachi 5-4800, Hitachi, Tokyo, Japan), transmission electron microscope carried out on a transmission electron microscope (TE, TecnaiG220, FEI, Hillsboro, OR, USA), and high-angle annular dark-field scanning TEM (HAADF-STEM) at 200 kV. The X-ray diffraction pattern (XRD) was recorded on an X-ray diffractometer (X'Pert-Pro MPD, PANalytical Co., Almelo, The Netherlands) using a Cu Kα X-ray source ($\lambda$=1.540598 Å). The Fourier transform infrared spectra were recorded on a Thermo Nicolet Nexus 670 FTIR spectrometer (Thermo Scientific, Madison, WI, USA). The Raman spectra were recorded on a PerkinElmer RamanStation 400 spectrometer with a 785 nm laser as an excitation source.

X-Ray Detection Fabrication

X-ray detection devices were fabricated using a simple casting method. First, 30% (w/v) polyvinyl acetate (PVAc) solution was prepared by dissolving methanol under magnetic stirring for 3 hours. Each carbon nitride sample was then dispersed in 1 mL PVAc solution to prepare a 5% (w/v ratio) concentration solutions labelled PVAc/$C_3N_4$, PVAc/$C_3N_4$/Cu, PVAc/$C_3N_4$/Fe, and PVAc/$C_3N_4$/Cu/Fe. ITO glass (1.5×1.5 cm, ITO layer thickness 185±20 nm and 10 ohm) was used as a conductive substrate after cleaning with acetone and DI water and drying in air. Different volumes (70 μL or 100 μL) of each sample were cast in ITO and the solvent was allowed to evaporate in air and kept in oven overnight at 60° C. to ensure all solvent evaporated. A thin layer of silver paste (1×1 cm) was painted over the membrane. Two copper wires were connected. One side was connected to the I-V source dvec and another side was connected to the ITO and silver layer.

X-Ray Measurements

Each device was fixed inside the X-ray instrument (Rontgengerat 35 KV, Grundgerat, 09058.99) and exposed to x-ray directly with a distance of 20 cm from the source. The current was recorded with time under applied different voltages (15, 50, and 100 volt) using a Keithley instrument (238 high current source unit) during exposure to different X-ray doses (20 s (on) and 20 s (off)) with IV measuring from −100 V to 100V in dark and different doses.

Results

Figure 1A:
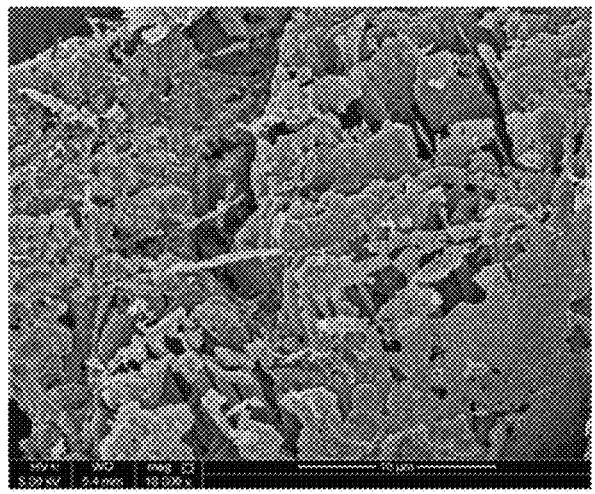
FIG. 1A is an SEM image of gCNs.
Figure 1B:
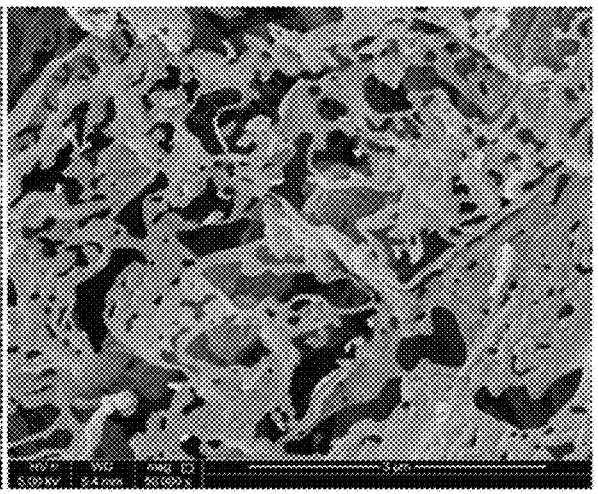
FIG. 1B is an SEM image of CuFe/gCNs.
Figure 1C:
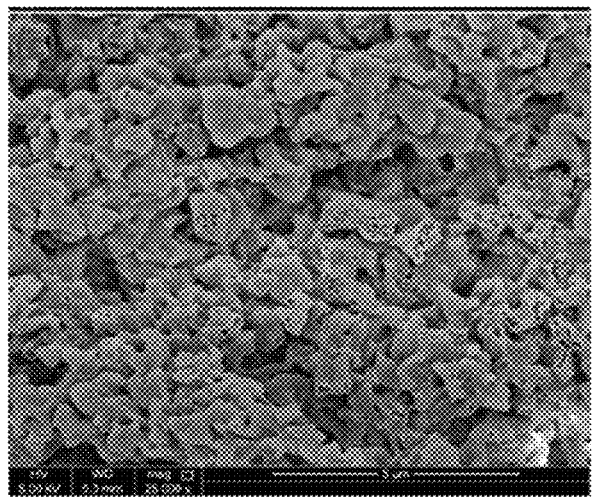
FIG. 1C is an SEM image of Fe/gCNs.
Figure 1D:
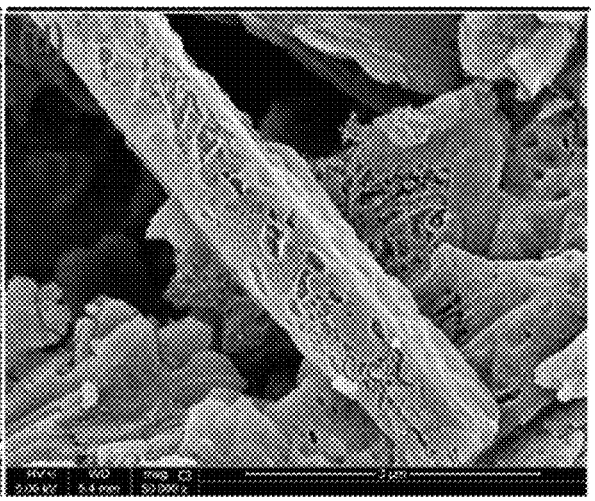
FIG. 1D is an SEM image of Cu/gCNs.

FIG. 1A is an SEM image of the gCNs synthesized as described above. The gCNs were formed as hierarchical porous nanosheet structures with abundant pores. The same porous structures were retained after impeding copper with iron to afford CuFe/gCNs (FIG. 1), iron to afford Fe/gCNs (FIG. 1C), and copper to afford Cu/gCNs (FIG. 1D).

Figure 2A:
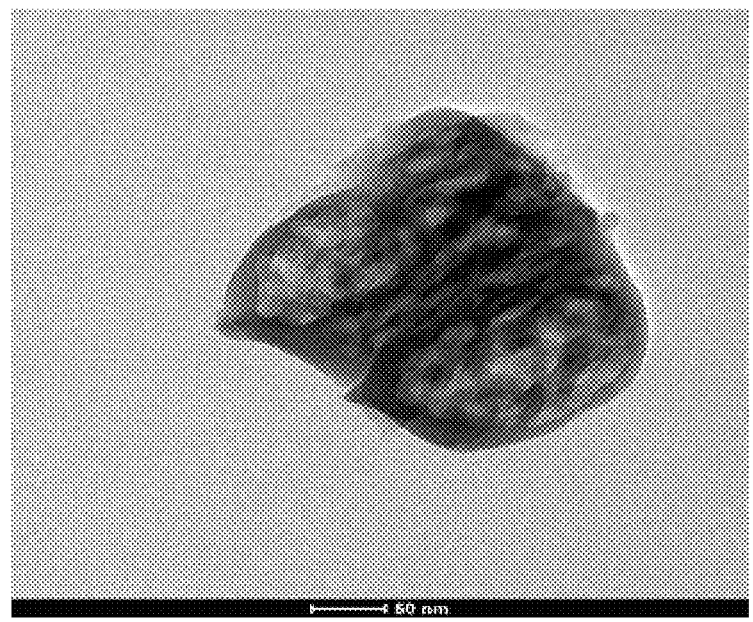
FIG. 2A is a TEM image of gCNs.
Figure 2B:
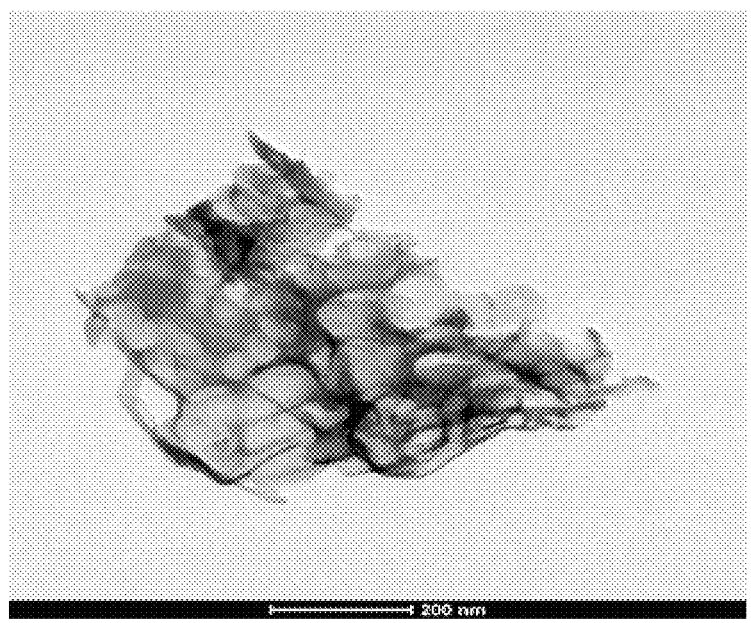
FIG. 2B is a TEM image of CuFe/gCNs.
Figure 2C:
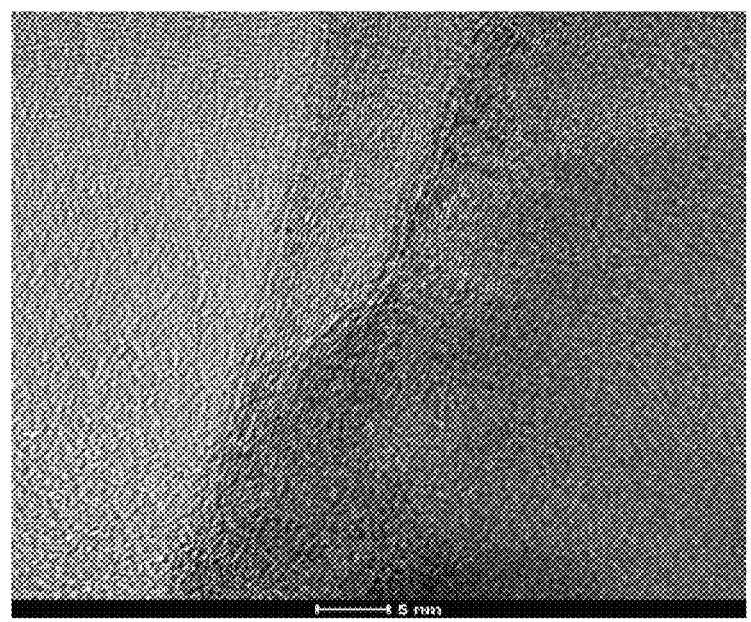
FIG. 2C is a high resolution TEM image of CuFe/gCNs. wherein the CuFe/gCN is cast in the ITO with thicknesses of 70 μM and 100 μM.

FIG. 2A and FIG. 2B are TEM images of gCNs and CuFe/gCNs, respectively, which both show that bimetal Cu/Fe dopants enhance the porosity of gCNs. FIG. 2C is a high-resolution TEM image of CuFe/gCNs that shows the high crystallinity and graphitization of the exterior layer and the amorphous phase of the inner sheet layers.

Figure 3A:
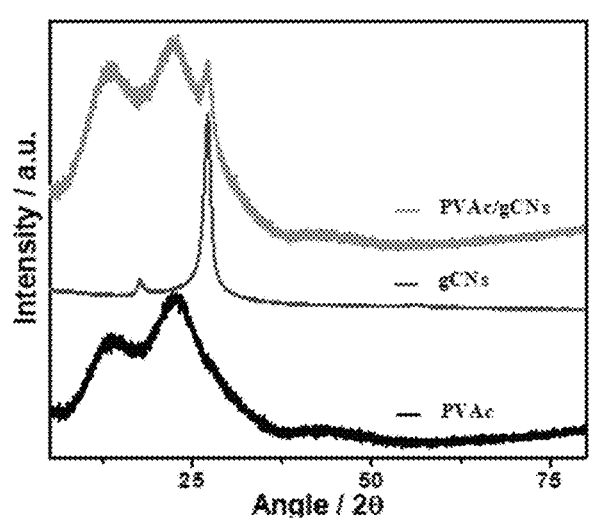
FIG. 3A is the XRD diffraction patterns of gCNs with and without PVACs.
Figure 3B:
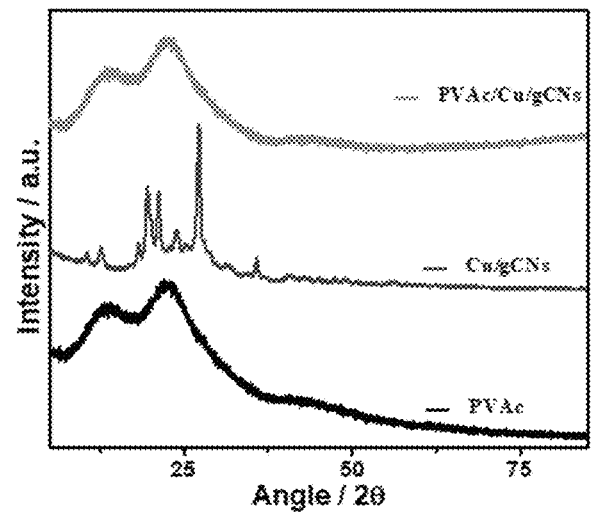
FIG. 3B is the XRD diffraction patterns of Cu/gCNs with and without PVACs.
Figure 3C:
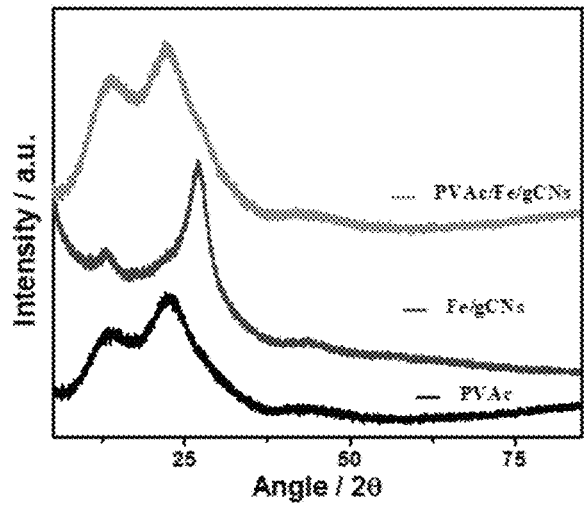
FIG. 3C is the XRD diffraction patterns of Fe/gCNs with and without PVACs.
Figure 3D:
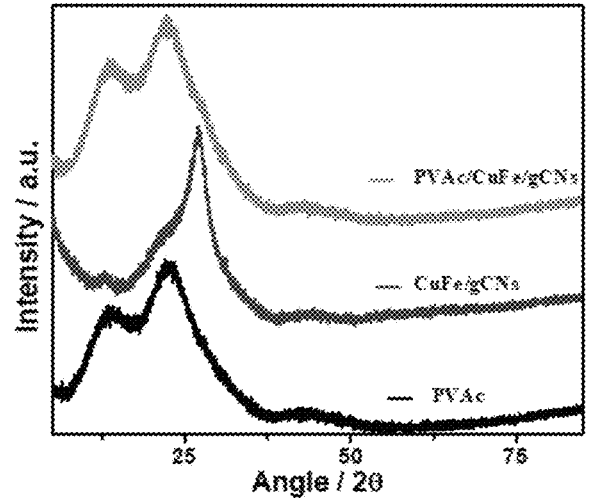
FIG. 3D is the XRD diffraction patterns of CuFe/gCNs with and without PVACs.

The XRD diffraction pattern of PVAc/gCNs compared to PVAc and gCNs is shown in FIG. 3A. Similarly, the XRD diffraction patterns of PVAc/Cu/gCNs, PVAc/Fe/gCNs and PVAc/CuFe/gCNs compared to PVAc and their respective gCNs are shown in FIGS. 3B-3D. gCNs, Fe/gCNs, and CuFe/gCNs with and without PVAc depicted typical diffraction patterns at 2θ of 13° of (100) facet and at 27° (002) facet of graphitic gCNs. In addition to (002) and (100) facets, Cu/gCNs showed unknown phases that may correlate to uncondensed melamine. PVAc showed only an amorphous carbon phase and ITO peak.

Figure 4A:
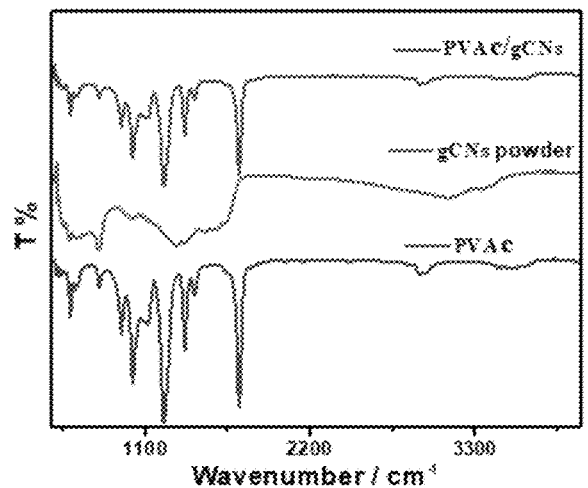
FIG. 4A is the FTIR analysis of gCNs with and without PVACs.
Figure 4B:
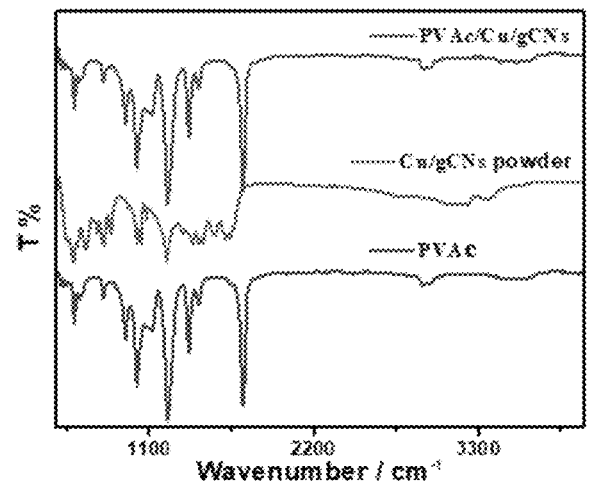
FIG. 4B is the FTIR analysis of Cu/gCNs with and without PVACs.
Figure 4C:
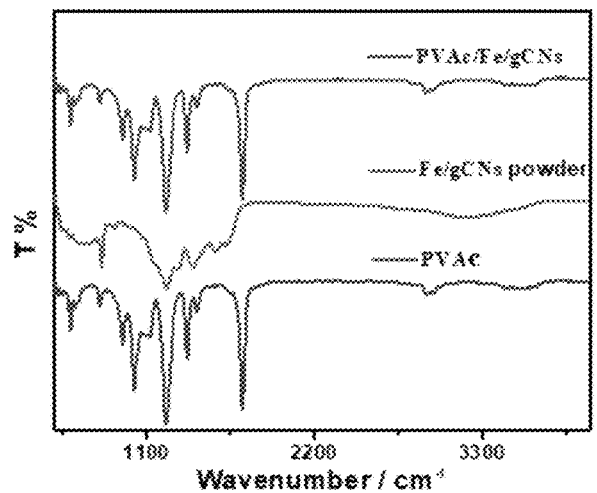
FIG. 4C is the FTIR analysis of Fe/gCNs with and without PVACs.
Figure 4D:
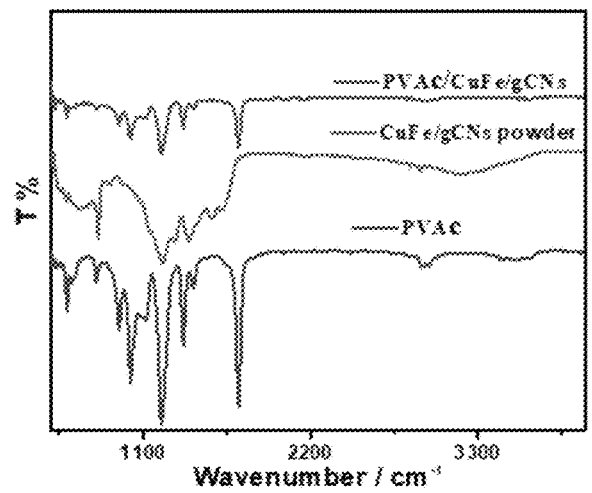
FIG. 4D is the FTIR analysis of CuFe/gCNs with and without PVACs.

FTIR spectra of PVAc/gCNs (FIG. 4A), PVAc/Cu/gCNs (FIG. 4B), PVAc/Fe/gCNs (FIG. 4C), and PVAc/CuFe/gCNs (FIG. 4D) were taken and compared to PVAc and their respective gCNs. gCNs-samples with and without PVAc showed small broad bands between 3000 and 3600 $cm^{-1}$ attributed to N-H vibrations, a peak at 810 $cm^{-1}$ for the breathing mode of triazine, and peaks at 1150-1633 $cm^{-1}$ for the stretching mode of C-N heterocycles. These peaks, but with less intensity, were also observed in the cases of metal doped gCNs.

Figure 5A:
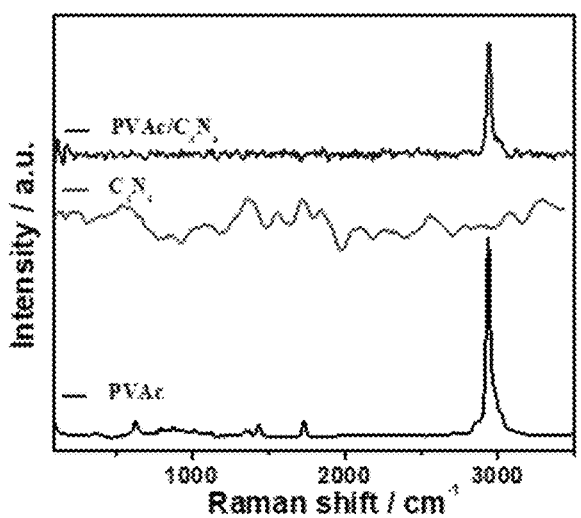
FIG. 5A is the Raman spectra of gCNs with and without PVACs.
Figure 5B:
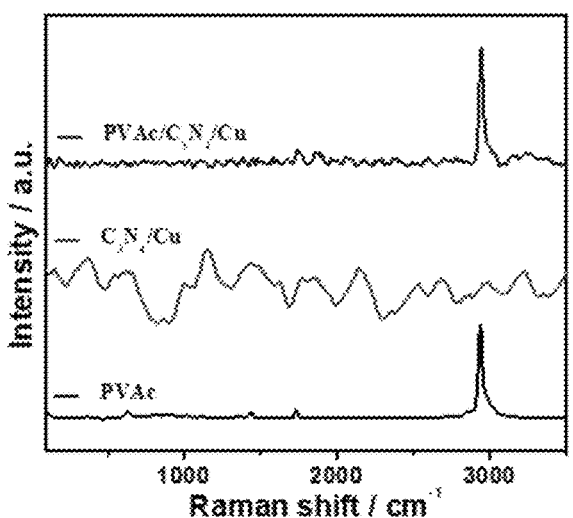
FIG. 5B is the Raman spectra of Cu/gCNs with and without PVACs.
Figure 6C:
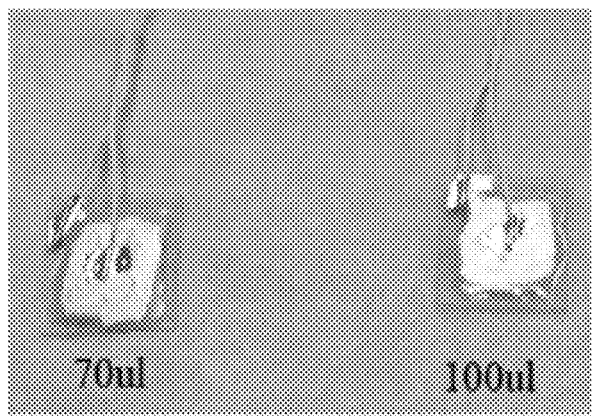
FIG. 6C is an image of X-ray devices comprising Fe/gCNs over an ITO substrate wherein the Fe/gCN is cast in the ITO with thicknesses of 70 μM (left) and 100 μM (right).
Figure 6D:
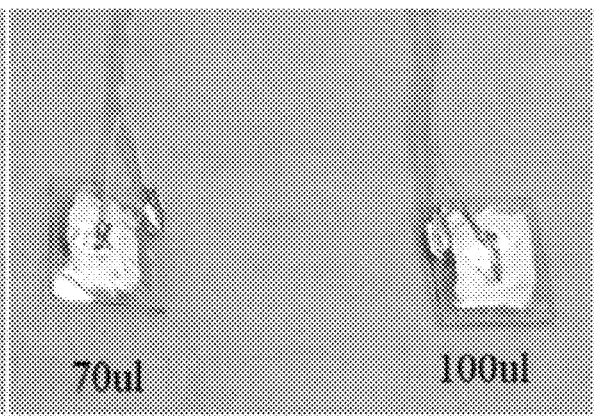
FIG. 6D is an image of X-ray devices comprising CuFe/gCNs over an ITO substrate wherein the CuFe/gCN is cast in the ITO with thicknesses of 70 μM (left) and 100 μM (right).

Raman spectra of PVAc/gCNs (FIG. 5A), PVAc/Cu/gCNs (FIG. 5B), PVAc/Fe/gCNs (FIG. 5C), and PVAc/CuFe/gCNs (FIG. 5D) were taken and compared to PVAc and their respective gCNs.

FIG. 6A-6D are photo images of X-ray devices synthesized with gCNs (FIG. 6A), Cu/gCNs (FIG. 6B), Fe/gCNs (FIG. 6C), and CuFe/gCNs (FIG. 6D) over ITO substrates. Each X-ray device was synthesized with a thickness of either 70 μM and 100 μM. The 70 μM thick devices are shown on the left of each figure and the 100 μM thick devices are shown of the right.

Figure 7A:
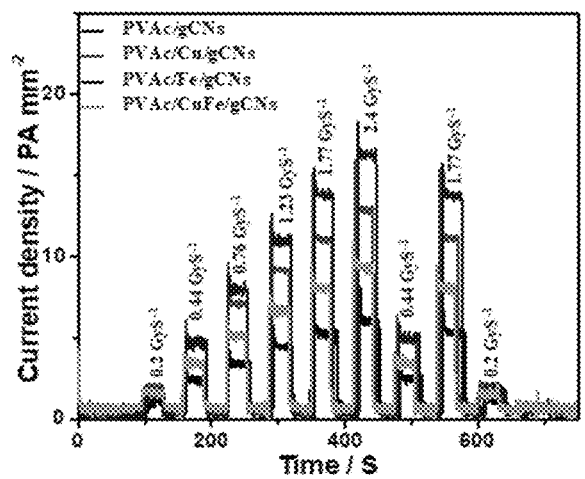
FIG. 7A is a graph comparing the X-ray on-off current density as a function of time for X-ray detection devices fabricated with PVAc/gCNs, PVAc/Cu/gCNs, PVAc/Fe/gCNs, and PVAc/CuFe/gCNs with a thickness of 70 μM under an applied potential of 15 V at different X-ray doses (0.2-2.4 Gy/s).
Figure 7B:
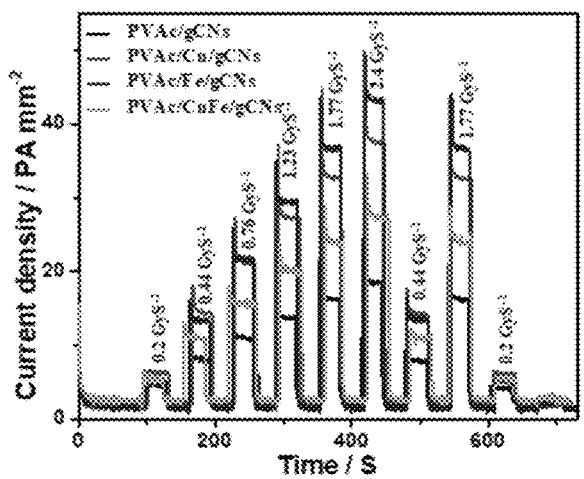
FIG. 7B is a graph comparing the X-ray on-off current density as a function of time for X-ray detection devices fabricated with PVAc/gCNs, PVAc/Cu/gCNs, PVAc/Fe/gCNs, and PVAc/CuFe/gCNs with a thickness of 70 μM under an applied potential of 50 V at different X-ray doses (0.2-2.4 Gy/s).
Figure 7C:
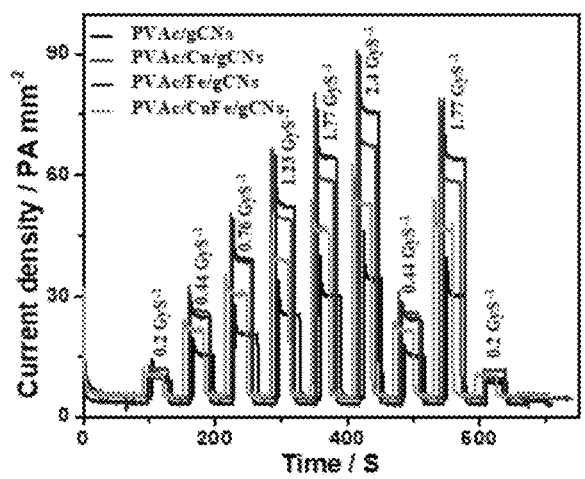
FIG. 7C is a graph comparing the X-ray on-off current density as a function of time for X-ray detection devices fabricated with PVAc/gCNs, PVAc/Cu/gCNs, PVAc/Fe/gCNs, and PVAc/CuFe/gCNs with a thickness of 70 μM under an applied potential of 100 V at different X-ray doses (0.2-2.4 Gy/s).

FIGS. 7A-7C show the X-ray on-off current density as a function of time (0 seconds to 600 seconds) of X-ray detection devices comprised of PVAc/gCNs, PVAc/Cu/gCNs, PVAc/Fe/gCNs, and PVAc/CuFe/gCNs with a thickness of 70 μM, under applied potentials of 15 V (FIG. 7A), 50 V (FIG. 7B), and 100 V (FIG. 7C). All samples showed a quick response under X-ray, followed by sudden decay without X-ray. Also, all samples substantially increased in the current when increasing the applied potential and X-ray doses. The current density of X-ray detection devices comprising PVAc/Fe/gCNs and PVAc/Cu/gCNs were higher than that of X-ray detection devices comprising PVAc/CuFe/gCNs and PVAc/gCNs under all applied potential.

Figure 7D:
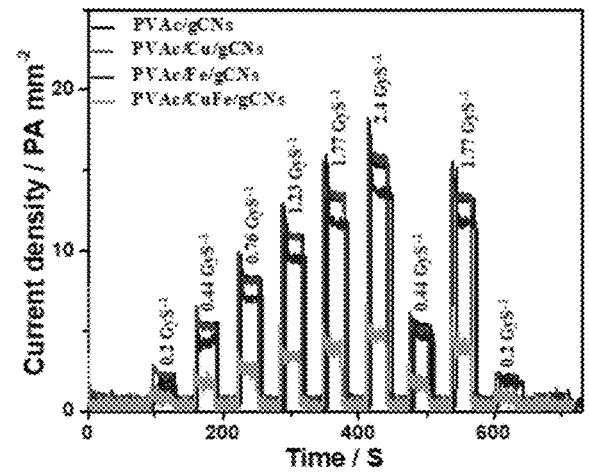
FIG. 7D is a graph comparing the X-ray on-off current density as a function of time for X-ray detection devices fabricated with PVAc/gCNs, PVAc/Cu/gCNs, PVAc/Fe/gCNs, and PVAc/CuFe/gCNs with a thickness of 100 μM under an applied potential of 15 V at different X-ray doses (0.2-2.4 Gy/s).
Figure 7E:
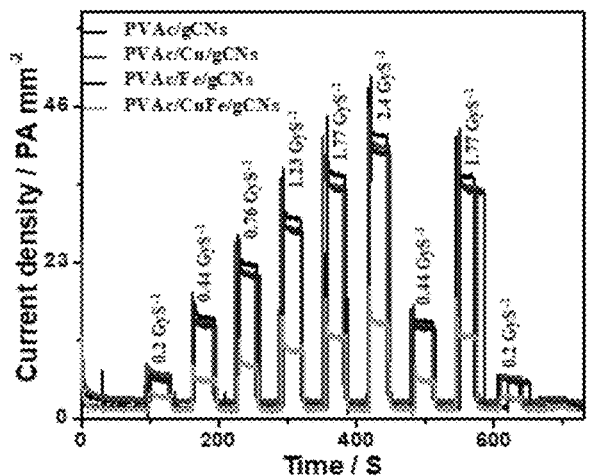
FIG. 7E is a graph comparing the X-ray on-off current density as a function of time for X-ray detection devices fabricated with PVAc/gCNs, PVAc/Cu/gCNs, PVAc/Fe/gCNs, and PVAc/CuFe/gCNs with a thickness of 100 μM under an applied potential of 50 V at different X-ray doses (0.2-2.4 Gy/s).
Figure 7F:
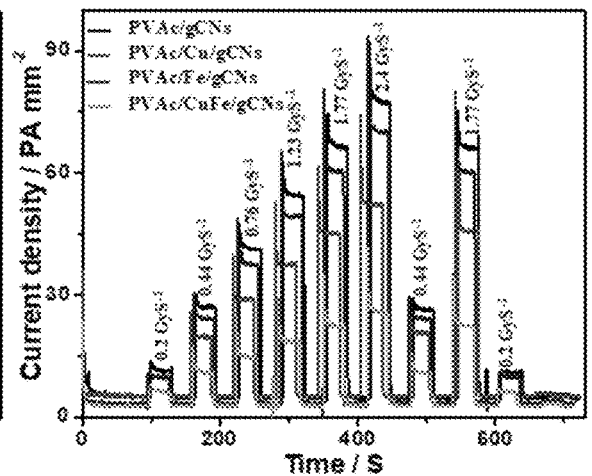
FIG. 7F is a graph comparing the X-ray on-off current density as a function of time for X-ray detection devices fabricated with PVAc/gCNs, PVAc/Cu/gCNs, PVAc/Fe/gCNs, and PVAc/CuFe/gCNs with a thickness of 100 μM under an applied potential of 100 V at different X-ray doses (0.2-2.4 Gy/s).

FIG. 7D-7F show the X-ray on-off current density as a function of time (0 seconds to 600 seconds) of X-ray detection devices comprised of PVAc/gCNs, PVAc/Cu/gCNs, PVAc/Fe/gCNs, and PVAc/CuFe/gCNs with a thickness of 100 μM, under applied potentials of 15 V (FIG. 7D), 50 V (FIG. 7E), and 100 V (FIG. 7F). Similarly to the samples with a thickness of 70 μM, all samples showed a quick response under X-ray, followed by sudden decay without X-ray. Also, all samples showed a substantial increase in the current when increasing the applied potential and X-ray doses.

X-ray detection devices made from PVAc/Fe/gCNs, PVAc/Cu/gCNs, and PVAc/gCNs exhibited similar current density and were higher than the current density of X-ray detection devices made from PVAc/CuFe/gCNs under all applied potentials. To validate the durability, as well as the feasibility, for the large scale applications, after reaching an X-ray dose of 2.4 Gy/s at 420 seconds, the gCNs materials were exposed to X-ray doses of 0.44, 1.77 and 0.2 Gy/s. The gCNs displayed the current compared to the initial X-ray doses of 0.44, 1.77 and 0.2 Gy/s.

Figure 8A:
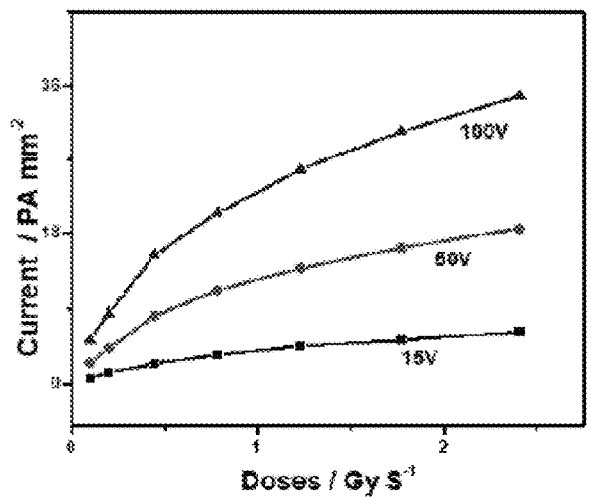
FIG. 8A is the X-ray current density of an X-ray detection device fabricated with gCNs with a thickness of 70 μM under different X-ray doses from 0.2 to 2.4 Gy/s and an applied voltage of 15 V, 50 V, and 100 V.
Figure 8B:
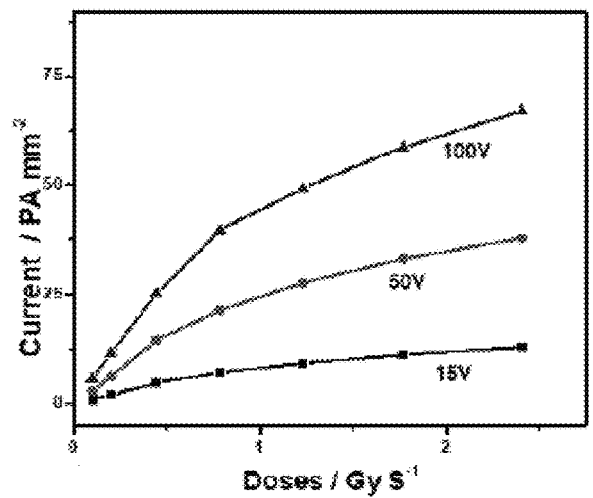
FIG. 8B is the X-ray current density of an X-ray detection device fabricated with Cu/gCNs with a thickness of 70 μM under different X-ray doses from 0.2 to 2.4 Gy/s and an applied voltage of 15 V, 50 V, and 100 V.
Figure 8C:
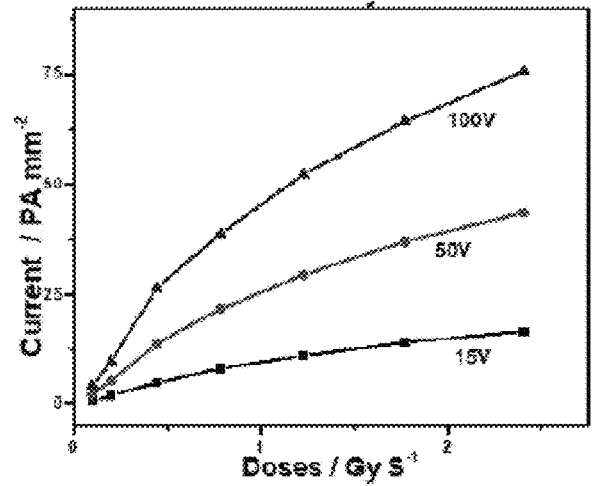
FIG. 8C is the X-ray current density of an X-ray detection device fabricated with Fe/gCNs with a thickness of 70 μM under different X-ray doses from 0.2 to 2.4 Gy/s and an applied voltage of 15 V, 50 V, and 100 V.
Figure 8D:
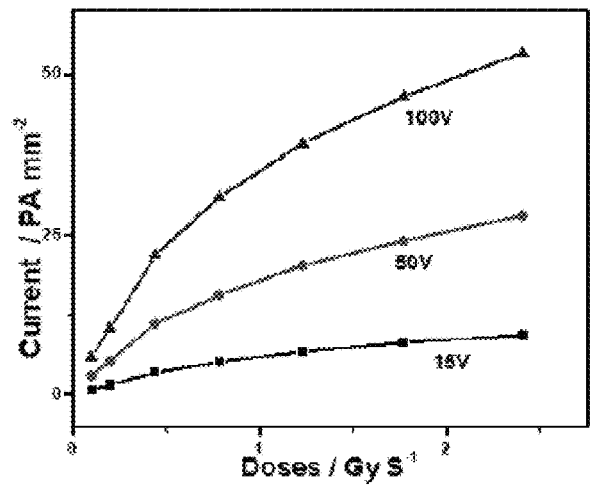
FIG. 8D is the X-ray current density of an X-ray detection device fabricated with CuFe/gCNs with a thickness of 70 μM under different X-ray doses from 0.2 to 2.4 Gy/s and an applied voltage of 15 V, 50 V, and 100 V.

FIG. 8A shows that the X-ray current density of the X-ray detection device fabricated with gCN (thickness of 70 μM) increased steadily when the X-ray dose was increased from 0.2 to 2.4 Gy/S under applied potentials of 15 V, 50 V, and 100 V. FIGS. 8B-8D show the effect of X-ray dose on X-ray current density of X-ray detection devices fabricated with Cu/gCNs, Fe/gCNs, and CuFe/gCNs, respectively. The X-ray current increased from 1.3 to 34.8 pA $mm^2$ with gCNs (FIG. 8A), from 2 to 67.8 pA $mm^2$ with Cu/gCNs (FIG. 8B), from 1.89 to 75.7 pA $mm^2$ with Fe/gCNs (FIG. 8C), and from 1.58 to 53.3 pA $mm^2$ with CuFe/gCNs (FIG. 8D).

Figure 9A:
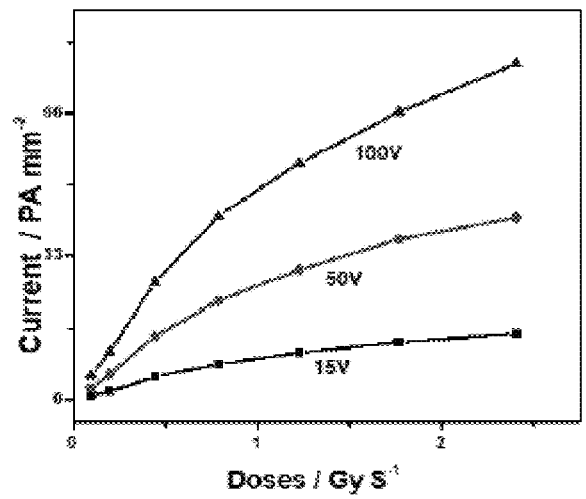
FIG. 9A is the X-ray current density of an X-ray detection device fabricated with gCNs with a thickness of 100 μM under different X-ray doses from 0.2 to 2.4 Gy/s and an applied voltage of 15 V, 50 V, and 100 V.
Figure 9B:
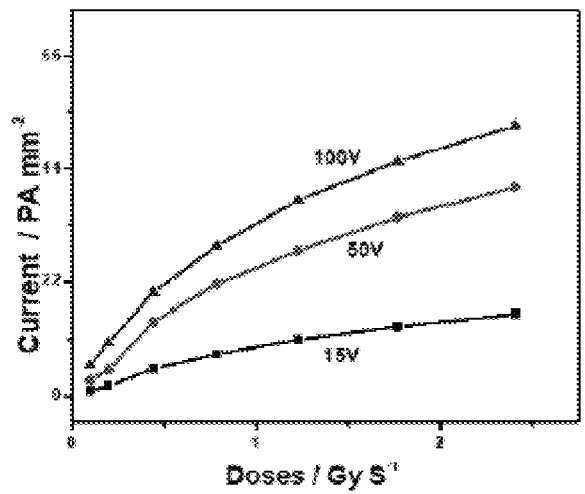
FIG. 9B is the X-ray current density of an X-ray detection device fabricated with Cu/gCNs with a thickness of 100 μM under different X-ray doses from 0.2 to 2.4 Gy/s and an applied voltage of 15 V, 50 V, and 100 V.
Figure 9C:
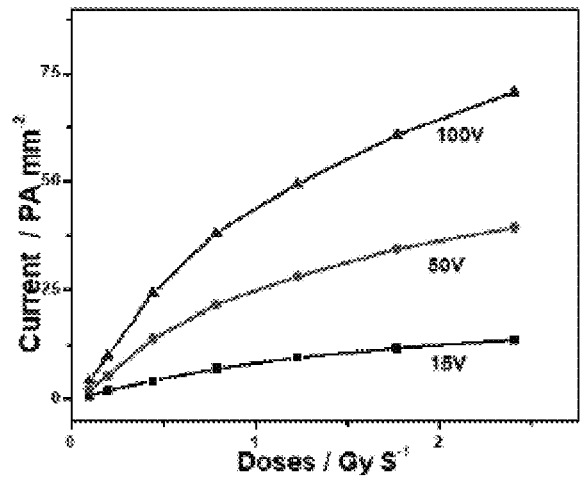
FIG. 9C is the X-ray current density of an X-ray detection device fabricated with Fe/gCNs with a thickness of 100 μM under different X-ray doses from 0.2 to 2.4 Gy/s and an applied voltage of 15 V, 50 V, and 100 V.
Figure 9D:
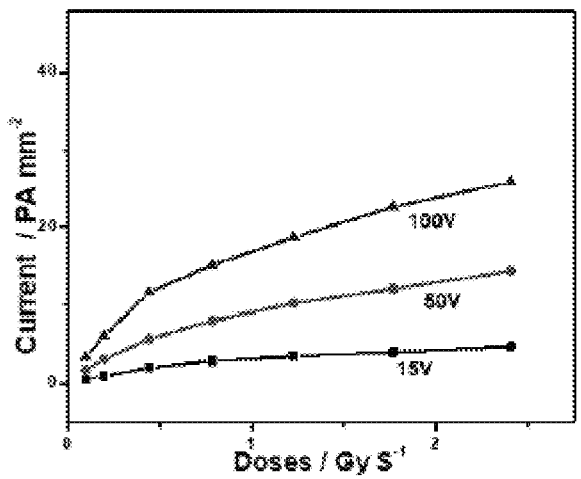
FIG. 9D is the X-ray current density of an X-ray detection device fabricated with CuFe/gCNs with a thickness of 100

FIGS. 9A-9D show that the X-ray current density of X-ray detection devices fabricated with gCN, Cu/gCNs, Fe/gCNs, and CuFe/gCNs (thickness of 100 μM) increased steadily when increasing the X-ray doses from 0.2 to 2.4 Gy/S under applied potentials of 15 V, 50 V, and 100 V. The X-ray current increased from 2 to 77.5 pA $mm^2$ with gCNs (FIG. 9A), from 2.04 to 52.5 pA $mm^2$ with Cu/gCNs (FIG. 9B), from 1.89 to 70.8 pA $mm^2$ on Fe/gCNs (FIG. 9C), and from 0.97 to 25.8 pA $mm^2$ with CuFe/gCNs (FIG. 9D).

FIG. 10A and FIG. 10B are graphs of the X-ray dark current density as a function of applied potential of X-ray detection devices fabricated with PVAc/gCNs, PVAc/Cu/gCNs, PVAc/Fe/gCNs, and PVAc/CuFe/gCNs with a thickness of 70 μM (FIG. 10A) or 100 μM (FIG. 10B). All samples showed a considerable increase in the X-ray off dark current from 0.4 pA $mm^2$ to 5.1 pA $mm^2$ when increasing the applied potential from 15 V to 100 V. When the PVAc/gCNs was 70 µM thick, the dark current density of PVAc/Fe/gCNs was lower than that of PVAc/CuFe/gCNs, PVAc/Cu/gCNs, and PVA/gCNs. When the PVAc/gCNs was 100 µM thick, the dark current density of PVAc/CuFe/gCNs was lower than that of PVAc/Fe/gCNs, PVAc/Cu/gCNs, and PVA/gCNs, respectively.

The X-ray dark currents of all gCNs-based sensors with a thickness of 100 µM were lower than that at a thickness of 70 µM, and PVAc/CuFe/gCNs showed the lowest current (0.4-2.8 pA mm$^2$). Importantly, the dark currents of all gCNs-based sensors (0.4-5.1 pA mm$^2$) were lower than the industrially relevant values of 1-10 pA mm$^2$ even when increasing the applied voltage to 100 V.

X-rays sensitivity (S) is defined as:

$$A = \frac{Q}{DA} = \frac{\int (I_{X-ray}(t) - I_{dark})dt}{DA}$$

where, Q, D, and A represent the charge generated under irradiation, X-ray incident dose and active area of the detector, respectively. $I_{X-ray}$ and $I_{dark}$ represent the current under applied X-ray irradiation and in the dark, respectively.

FIGS. 11A-11D show the X-ray sensitivity of X-ray detection devices fabricated with PVAc/gCNs, PVAc/Cu/gCNs, PVAc/Fe/gCNs, and PVAc/CuFe/gCNs, respectively, under applied potentials of 15 V, 50 V, and 100 V. FIGS. 11A, 11B, and 11D are graphs of the X-ray sensitivity for devices where the PVAc/gCN layer is 70 µM thick, while FIG. 11C shows the X-ray sensitivity of devices where the PVAc/Fe/gCNs layer is 70 µM and 100 µM thick. As shown in FIGS. 11A-11D, sensitivity enhanced steadily with incremental changes in the potential from 15 to 100 V under different X-ray doses from 0.2 to 2.4 Gy/S.

The X-ray sensitivity increased from 3.7 to 12.37 PCGY$^{-1}$/cm$^2$ with gCNs detection devices (FIG. 11A), from 7.1 to 25.9 PCGY$^{-1}$/cm$^2$ with Cu/gCNs detection devices (FIG. 11B), from 7.35 to 30 PCGY$^{-1}$/cm$^2$ with Fe/gCNs detection devices (FIG. 11C), and from 4.9 to 19.8 PCGY$^{-1}$/cm$^2$ with CuFe/gCNs detection devices (FIG. 11D).

FIGS. 12A-12D show the X-ray sensitivity for X-ray detection devices fabricated with PVAc/gCNs, PVAc/Cu/gCNs, PVAc/Fe/gCNs, and PVAc/CuFe/gCNs, respectively, with a thickness of 100 µM under applied potentials of 15 V, 50 V, and 100 V. All samples with a thickness of 100 µM enhanced steadily with incremental changes in the potential from 15 to 100 V under different X-ray doses from 0.2 to 2.4 Gy/S. Particularly, the X-ray sensitivity increased from 6 to 30.27 PCGY$^{-1}$/cm$^2$ on gCNs (FIG. 12A), from 6.1 to 19.6 PCGY$^{-1}$/cm$^2$ on Cu/gCNs (FIG. 12B), from 7.15 to 28.6 PCGY$^{-1}$/cm$^2$ on Fe/gCNs (FIG. 12C), and from 2.86 to 9.5 PCGY$^{-1}$/cm$^2$ on CuFe/gCNs (FIG. 12D).

The dark current density is defined as $$I_{dark\ density} = \frac{I}{A}$$

FIGS. 13A-13D shows the X-ray current measured over a potential window between −100 V and 100 V under different doses from 0.2 to 2.4 Gy/S for X-ray detection devices fabricated with PVAc/gCNs, PVAc/Cu/gCNs, PVAc/Fe/gCNs, and PVAc/CuFe/gCNs, respectively, with a thickness of 70 µM. All samples showed a significant enhancement in the X-ray current density and X-ray dark current when increasing the potential in the positive or in the negative values. The X-ray dark current density of X-ray devices with a thickness of 70 µM enhanced steady with incremental changes in the potential window of 0.1 to 100 V and −0.1 to −100 V under different X-ray doses.

The X-ray current varied between 17.2-62 PA mm$^{-2}$ with the gCNs detection device (FIG. 13A), 17.7-67 PA mm$^{-2}$ with the Cu/gCNs detection device (FIG. 13B), 18.7-94 PA mm$^{-2}$ with the Fe/gCNs detection device (FIG. 13C), and 19.2-100 PA mm$^{-2}$ with the CuFe/gCNs detection device (FIG. 13D). The X-ray dark currents of devices fabricated with gCNs, Cu/gCNs, Fe/gCNs, and CuFe/gCNs were about 24-11, 11-29, 9.975-16.6, and 11.3-28 PA mm$^{-2}$, respectively.

FIGS. 14A-14D shows the X-ray current measured over a potential window between −100 V and 100 V under different doses from 0.2 to 2.4 Gy/S for X-ray detection devices fabricated with PVAc/gCNs, PVAc/Cu/gCNs, PVAc/Fe/gCNs, and PVAc/CuFe/gCNs, respectively, with a thickness of 100 µM. All samples showed a significant enhancement in the X-ray current density and X-ray dark current when increasing the potential in the positive or in the negative values. The X-ray dark current density of X-ray devices with a thickness of 100 µM enhanced steadily with incremental changes in the potential window of 0.1 to 100 V and −0.1 to −100 V under different X-ray doses.

The X-ray current varied between 20-110 PA mm$^{-2}$ with the gCNs detection device (FIG. 14A), 21.7-100.4 PA mm$^{-2}$ with the Cu/gCNs detection device (FIG. 14B), 18.25-80 PA mm$^{-2}$ with the Fe/gCNs (FIG. 14C), and 14.5-80 PA mm$^{-2}$ with the CuFe/gCNs detection device (FIG. 14D). The X-ray dark currents of devices fabricated with gCNs, Cu/gCNs, Fe/gCNs, and CuFe/gCNs, were about 24-11, 11-29, 9.975-16.6, and 11.3-28 PA mm$^{-2}$, respectively at potential window between −100 V and 100 V under different doses from 0.2 to 2.4 Gy/S using a thickness of 70 µm.

FIG. 15A and FIG. 15B show the X-ray response times measured at 15, 50, and 100 V under an X-ray dose of 0.2 Gy/S and 2.4 Gy/S, respectively, for X-ray detection devices fabricated with PVAc/gCNs, PVAc/Cu/gCNs, PVAc/Fe/gCNs, and PVAc/CuFe/gCNs with a thickness of 70 µM. All samples with a thickness of 70 µm showed outstanding X-ray response times, which varied with the applied potential.

The X-ray response times of devices fabricated with gCNs, Cu/gCNs, Fe/gCNs, and CuFe/gCNs were about 0.6-1.8, 0.6-1.3, 0.1-0.9, and 0.15-0.95 seconds, respectively (FIG. 15A) under an X-ray dose of 0.2 Gy/S. The best X-ray response time was achieved at 50 V with the Fe/gCNs detection device, at 15 V with the CuFe/gCNs detection device, and at 100 V with both the gCNs and Cu/gCNs detection devices.

FIG. 15C and FIG. 15D show the X-ray decay times measured at 15, 50, and 100 V under an X-ray dose of 0.2 Gy/S and 2.4 Gy/S, respectively, for X-ray detection devices fabricated with PVAc/gCNs, PVAc/Cu/gCNs, PVAc/Fe/gCNs, and PVAc/CuFe/gCNs with a thickness of 70 µM. The X-ray decay times were about 0.25-1, 0.8-1.1, 1.5-1.6, and 0.9-1.8 seconds with gCNs, Cu/gCNs, Fe/gCNs, and CuFe/gCNs detection devices, respectively, (FIG. 15C). Under an X-ray dose of 2.4 Gy/S, the X-ray decay times were about 0.3-65, 0.3-0.4, 0.45-0.64, and 0.3-0.4 seconds with gCNs, Cu/gCNs, Fe/gCNs, and CuFe/gCNs detection devices, respectively (FIG. 15D).

The X-ray decay times of CuFe/gCNs, Fe/gCNs, and Cu/gCNs detection devices were similar at 15 V and 50 V, and were quicker than gCNs at 15V and 50 V. At 100 V, CuFe/gCNs, gCNs, and Cu/gCNs decay times were similar at 100 V, and were quicker than the decay time of the Fe/gCNs detection device. The X-ray decay times were about 0.4-0.7, 0.3-0.95, 0.3-0.45, and 0.28-0.8 seconds with gCNs, Cu/gCNs, Fe/gCNs, and CuFe/gCNs detection devices, respectively, under an X-ray does of 2.4 Gy/S (FIG. 15D). The X-ray response times of all gCNs devices were close to their decay time, which is important for the reducibility, practicability, and feasibility in large-scale applications.

FIG. 16A and FIG. 16B show the X-ray response times measured at 15, 50, and 100 V under an X-ray dose of 0.2 Gy/S and 2.4 Gy/S, respectively, for X-ray detection devices fabricated with PVAc/gCNs, PVAc/Cu/gCNs, PVAc/Fe/gCNs, and PVAc/CuFe/gCNs with a thickness of 100 µM. FIG. 16C and FIG. 16D show the X-ray decay times measured at 15, 50, and 100 V under an X-ray dose of 0.2 Gy/S and 2.4 Gy/S, respectively, for X-ray detection devices fabricated with PVAc/gCNs, PVAc/Cu/gCNs, PVAc/Fe/gCNs, and PVAc/CuFe/gCNs with a thickness of 70 µM.

All devices with a thickness of 100 µm showed outstanding X-ray responses times, which varied with the applied potential. The X-ray response times were about 0.15-0.92, 0.3-0.58, 0.15-0.2, and 0.62-0.25 seconds with the gCNs, Cu/gCNs, Fe/gCNs, and CuFe/gCNs detection devices, respectively (FIG. 16A) under an X-ray dose of 0.2 Gy/S. The X-ray response times of all samples were similar at 100 V. The X-ray decay times were about 0.3-2.2, 1.15-2.1, 1.1-1.4, 1.8-1.6 seconds with gCNs, Cu/gCNs, Fe/gCNs, and CuFe/gCNs detection devices, respectively, under an X-ray dose of 0.2 Gy/S (FIG. 16C). After increasing the X-ray dose to 2.4 Gy/S, the X-ray response times were about 0.45-0.6, 0.1-0.4, 0.2-0.25, and 0.48-0.52 seconds with the gCNs, Cu/gCNs, Fe/gCNs, and CuFe/gCNs detection devices, respectively (FIG. 16B). The X-ray decay times were about 0.4-0.9, 0.42-0.9, 0.48-0.7, and 0.4-1.2 seconds with the gCNs, Cu/gCNs, Fe/gCNs, and CuFe/gCNs detection devices, respectively, under an X-ray dose of 2.4 Gy/S (FIG. 16D). The X-ray response times of all gCNs devices were close to their decay time, which is important for the reducibility, practicability, and feasibility for the large-scale applications.

Table 1 summarizes the results discussed above for X-ray detection devices fabricated with gCNs, Cu/gCNs, Fe/gCNs, and CuFe/gCNs. The X-ray used was a 35 KV/1 mA tungsten source with a dose rate of 0.44 Gy $S^{-1}$. The operation voltage for the data from the table was 15V.

TABLE 1

Dark Current, Rise and Decay Current, and Sensitivity of X-ray detection devices fabricated with gCNs, Cu/gCNs, Fe/gCNs, and CuFe/gCNs

| Material | Device Dimension & composition | Dark current at zero dose | Rise and decay current 0.2 Gy/S and 15 V | Sensitivity 0.2 Gy/S and 15 V |
|---|---|---|---|---|
| PVAc/ $C_3N_4$ | ITO/(1 × 1) $cm^2$ 70 ul casting/Ag layer by casting | 0.7 PA $mm^2$ | 0.36 & 1 s | 3.98 $PCGy^{-1}cm^{-2}$ |
|  | ITO/(1 × 1) $cm^2$ 100 ul casting/ | 0.8 PA $mm^2$ | 0.63 & 62 s | 10.35 $PCGy^{-1}cm^{-2}$ |
| PVAc/ $C_3N_4$/ Cu | ITO/(1 × 1) $cm^2$ 70 ul casting/Ag layer by casting | 0.6 PA $mm^2$ | 0.63 & 1.1 s | 9.3 $PCGy^{-1}cm^{-2}$ |
|  | ITO/(1 × 1) $cm^2$ 100 u lcasting/ | 0.77 PA $mm^2$ | 0.2 & 1 s | 10 $PCGy^{-1}cm^{-2}$ |
| PVAc/ $C_3N_4$/ Fe | ITO/(1 × 1) $cm^2$ 70 ul casting/Ag layer by casting | 0.46 PA $mm^2$ | 0.4 & 0.9 s | 9.5 $PCGy^{-1}cm^{-2}$ |
|  | ITO/(1 × 1) $cm^2$ 100 ul casting/Ag layer by casting | 0.5 PA $mm^2$ | 2.15 & 0.9 s | 8.6 $PCGy^{-1}cm^{-2}$ |
| PVAc/ $C_3N_4$/ CuFe | ITO/(1 × 1) $cm^2$ 70 ul casting/Ag layer by casting | 0.5 PA $mm^2$ | 0.67 & 0.5 s | 6.5 $PCGy^{-1}cm^{-2}$ |
|  | ITO/(1 × 1) $cm^2$ 100 ul casting/ | 0.42 PA $mm^2$ | 0.2 & 0.9 s | 3.2 $PCGy^{-1}cm^{-2}$ |

The previous detailed description is of a small number of embodiments for implementing the invention and is not intended to be limiting in scope. One of skill in this art will immediately envisage the methods and variations used to implement this invention in other areas than those described in detail. The following claims set forth a number of the embodiments of the invention disclosed with greater particularity.

What is claimed is:

1. An X-ray sensor comprising carbon nitride cast in a conductive substrate wherein the carbon nitride is optionally doped with iron, copper, or a combination of iron and copper.

2. The X-ray sensor of claim 1, comprising carbon nitride cast in a conductive substrate.

3. The X-ray sensor of claim 1, wherein the carbon nitride is doped with iron.

4. The X-ray sensor of claim 1, wherein the carbon nitride is doped with copper.

5. The X-ray sensor of claim 1, wherein the carbon nitride is doped with copper and iron.

6. The X-ray sensor of claim 1, wherein the conductive substrate is a solid sheet of indium tin oxide (ITO), $TiO_2$, or aluminum; a hematite sheet; a magnetite sheet; or, stainless-steel.

7. The X-ray sensor of claim 1, wherein the conductive substrate is a solid sheet of indium tin oxide (ITO).

8. The X-ray sensor of claim 1, wherein the conductive substrate is solid glass, quartz, permanox, polystyrene, "PTFE" coated slides, poly-L-Lysine treated slides, or silane treated slides.

9. The X-ray sensor of claim 1, wherein the carbon nitride cast in the conductive substance is a layer that is about 50 µM to about 150 µM thick.

10. The X-ray sensor of claim 1, wherein the layer is about 70 µM thick.

11. The X-ray sensor of claim 1, wherein the layer is about 100 µM thick.

12. The X-ray sensor of claim 1, wherein the X-ray sensor exhibits a response time of less than about 5 seconds, less than about 3 seconds, or less than about 1 second to an X-ray dose that is between about 0.2-2.4 Gy/s under an applied potential between about 15 V and 100 V.

13. The X-ray sensor of claim 1, wherein the X-ray sensor exhibits a decay time of less than about 5 seconds, less than about 3 seconds, or less than about 1 second from an X-ray dose that is between about 0.2-2.4 Gy/s under an applied potential between about 15 V and 100 V.

14. The X-ray sensor of claim 1, wherein the X-ray sensor exhibits a response time and a decay time that are both less than about 5 seconds, less than about 3 seconds, or less than about 1 second to an X-ray dose that is between about 0.2-2.4 Gy/s under an applied potential between about 15 V and 100 V.

15. The X-ray sensor of claim 1, wherein the X-ray sensor exhibits a response time and a decay time that are both less than about 1 second to an X-ray dose that of about 0.2 Gy/s under an applied potential of about 15 V.

16. The X-ray sensor of claim 1, wherein the X-ray sensor exhibits a sensitivity of about 3 $PCGy^{-1}cm^2$ to 30 $PCGy^{-1}cm^2$ when exposed to an X-ray dose between about 0.2-2.4 Gy/s under applied potentials between about 15 V and 100 V.

17. The X-ray sensor of claim 1, wherein the X-ray sensor exhibits a sensitivity of about 3.2 $PCGy^{-1}cm^2$ to 10.35 $PCGy^{-1}cm^2$ when exposed to an X-ray dose of about 0.2 Gy/s under an applied potential of about 15 V.

18. The X-ray sensor of claim 1, wherein the X-ray sensor is characterized by a dark current between about 9 and 30 PA $mm^{-1}$ over a potential window between −100 V and 100 V.

19. The X-ray sensor of claim 1, wherein the X-ray sensor is characterized by ultra-high sensitivity (0.1-1000.35 $sPCGy^{-1}cm^{-2}$), low operational voltages, wide broad energy ranges (5-150 V), quick responses (0.1-60 sec), and low dark current (0.05-50 PA $mm^2$) from a dose rate of 0.01 to 40 Gy $s^{-1}$.

20. A method of manufacturing the carbon nitride of claim 1, comprising the following steps:
(a) adding an amine selected from melamine, urea, cyanuric acid, and pyridine to a solution of alcohol and slowly adding $HNO_3$ dropwise;
(b) stirring the mixture at room temperature to form a precipitate;
(c) washing the precipitate and drying the precipitate at approximately 80° C. for at least 12 hours; and
(d) annealing the precipitate at approximately 450° C. for at least 2 hours to afford the carbon nitride.

21. The method of claim 20, wherein the amine from step (a) is melamine.

22. The method of claim 20, wherein the solution of alcohol in step (a) further comprises $CuCl_2 \cdot 2H_2O$ or $FeCl_3 \cdot 6H_2O$ or a mixture of $CuCl_2 \cdot 2H_2O$ and $FeCl_3 \cdot 6H_2O$.

23. The method of claim 20, wherein the alcohol in step (a) is ethanol.

24. A method of manufacturing the X-ray sensor of claim 1, comprising the following steps:
(a) adding an amine selected from melamine, urea, cyanuric acid, and pyridine to a solution of alcohol and slowly adding $HNO_3$ dropwise;
(b) stirring the mixture at room temperature to form a precipitate;
(c) washing the precipitate and drying the precipitate at approximately 80° C. for at least 12 hours;
(d) annealing the precipitate at approximately 450° C. for at least 2 hours to afford the carbon nitride;
(e) dispersing the carbon nitride in a solution of a polymer and an alcohol;
(f) casting the solution of carbon nitride dispersed in the solution of a polymer and an alcohol into a conductive substrate to form a membrane;
(g) drying the membrane to evaporate the solvent; and
(h) painting the membrane with silver paste.

25. The method of claim 24, wherein the amine from step (a) is melamine.

26. The method of claim 24, wherein the solution of alcohol in step (a) further comprises $CuCl_2 \cdot 2H_2O$ or $FeCl_3 \cdot 6H_2O$ or a mixture of $CuCl_2 \cdot 2H_2O$ and $FeCl_3 \cdot 6H_2O$.

27. The method of claim 24, wherein the polymer is polyvinyl acetate, poly(vinyl alcohol), poly(vinylbutyral-co-vinyl alcohol-co-vinyl acetate), polyvinyl butyral, poly (vinyl formal), or poly methyl methacrylate.

28. The method of claim 27, wherein the polymer is polyvinyl acetate.

29. The method of claim 24, wherein the alcohol in step (f) is methanol.

30. The method of claim 24, wherein the conductive substrate is a solid sheet of indium tin oxide (ITO).

* * * * *